United States Patent
Lee et al.

(10) Patent No.: US 10,522,524 B2
(45) Date of Patent: Dec. 31, 2019

(54) DISPLAY DEVICE AND METHOD FOR FABRICATING THE SAME

(71) Applicant: LG Display Co., Ltd., Seoul (KR)

(72) Inventors: Seungchul Lee, Goyang-si (KR); Changho Lee, Paju-si (KR); Hanseok Kim, Paju-si (KR); Mira Yun, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/020,145

(22) Filed: Jun. 27, 2018

(65) Prior Publication Data

US 2019/0006335 A1    Jan. 3, 2019

(30) Foreign Application Priority Data

Jun. 30, 2017  (KR) .......... 10-2017-0083773
Dec. 13, 2017  (KR) .......... 10-2017-0171254

(51) Int. Cl.
*H01L 25/16*  (2006.01)
*G09G 3/32*   (2016.01)
(Continued)

(52) U.S. Cl.
CPC ............. *H01L 25/167* (2013.01); *G09G 3/32* (2013.01); *H01L 23/4985* (2013.01);
(Continued)

(58) Field of Classification Search
CPC ....... G09G 2300/02; G09G 2310/0259; G09G 2310/0272; G09G 2380/02; G09G 3/32;
(Continued)

(56) References Cited

U.S. PATENT DOCUMENTS 6,501,663 B1    12/2002  Pan
7,358,544 B2 *   4/2008  Sakamoto ............... H01L 33/20
                                                257/103
(Continued)

FOREIGN PATENT DOCUMENTS

KR    10-2002-0004511 A    1/2002
KR    10-2011-0085196 A    7/2011
(Continued)

OTHER PUBLICATIONS

Notice of Preliminary Examination Result dated Jul. 27, 2018, issued in corresponding Korean Patent Application No. 10-2017-0171254.
(Continued)

*Primary Examiner* — Dmitriy Bolotin
(74) *Attorney, Agent, or Firm* — Morgan, Lewis & Bockius LLP

(57) ABSTRACT

Disclosed herein are a display device with a reduced bezel area and a method for fabricating the same. A wiring electrode disposed on a substrate is electrically connected to a connection electrode disposed on an inclined surface of a circuit board in contact with the substrate, and the connection electrode is electrically connected to a circuit wiring disposed on the circuit board. Therefore, an inactive area such as a pad portion for connecting the substrate with the circuit board is not required, such that the bezel area can be reduced.

20 Claims, 10 Drawing Sheets

(51) Int. Cl.
*H01L 23/498* (2006.01)
*H01L 23/60* (2006.01)
*H01L 23/00* (2006.01)
*H01L 27/12* (2006.01)
*H01L 33/60* (2010.01)
*H01L 33/32* (2010.01)

(52) U.S. Cl.
CPC .. *H01L 23/49805* (2013.01); *H01L 23/49833* (2013.01); *H01L 23/60* (2013.01); *H01L 24/24* (2013.01); *H01L 24/32* (2013.01); *H01L 24/73* (2013.01); *H01L 24/82* (2013.01); *H01L 25/162* (2013.01); *H01L 27/124* (2013.01); *H01L 33/60* (2013.01); *G09G 2300/02* (2013.01); *G09G 2310/0259* (2013.01); *G09G 2310/0272* (2013.01); *G09G 2380/02* (2013.01); *H01L 33/32* (2013.01); *H01L 2224/24227* (2013.01); *H01L 2224/32225* (2013.01); *H01L 2224/73217* (2013.01); *H01L 2224/82103* (2013.01); *H01L 2224/82214* (2013.01)

(58) Field of Classification Search
CPC . H01L 2224/24227; H01L 2224/32225; H01L 2224/73217; H01L 2224/82103; H01L 2224/82214; H01L 23/49805; H01L 23/49833; H01L 23/4985; H01L 23/60; H01L 24/24; H01L 24/32; H01L 24/73; H01L 24/82; H01L 25/162; H01L 25/167; H01L 27/124; H01L 33/32; H01L 33/60; H05K 1/141; H05K 2201/09154; H05K 2201/10106; H05K 2201/10128; H05K 3/403
See application file for complete search history.

(56) References Cited

U.S. PATENT DOCUMENTS

| | | | |
|---|---|---|---|
| 8,130,177 B2* | 3/2012 | Nakatani | H01L 51/0003 313/498 |
| 8,791,474 B1 | 7/2014 | Bibl et al. | |
| 9,323,400 B2* | 4/2016 | Kim | G06F 3/044 |
| 2002/0050399 A1 | 5/2002 | Yang et al. | |
| 2004/0185301 A1* | 9/2004 | Tsuchiya | H01L 27/127 428/690 |
| 2005/0051829 A1* | 3/2005 | Goto | H01L 28/55 257/310 |
| 2006/0049527 A1* | 3/2006 | Hashimoto | H01L 23/13 257/773 |
| 2011/0176285 A1 | 7/2011 | Park et al. | |
| 2013/0161609 A1 | 6/2013 | Koyama | |
| 2014/0139413 A1* | 5/2014 | Kwon | G09G 3/3208 345/82 |
| 2015/0042903 A1 | 2/2015 | Misaki | |
| 2015/0309625 A1* | 10/2015 | Huang | G06F 3/0418 345/174 |
| 2018/0033832 A1* | 2/2018 | Park | G06F 1/1652 |

FOREIGN PATENT DOCUMENTS

| | | |
|---|---|---|
| KR | 10-2013-0071999 A | 7/2013 |
| KR | 10-2016-0054822 A | 5/2016 |

OTHER PUBLICATIONS

Notice of Allowance dated Aug. 29, 2018, issued in corresponding Korean Patent Application No. 10-2017-0171254.
Extended European Search Report dated Nov. 20, 2018, issued in corresponding European Patent Application No. 18180014.5.

* cited by examiner

[FIG. 1]
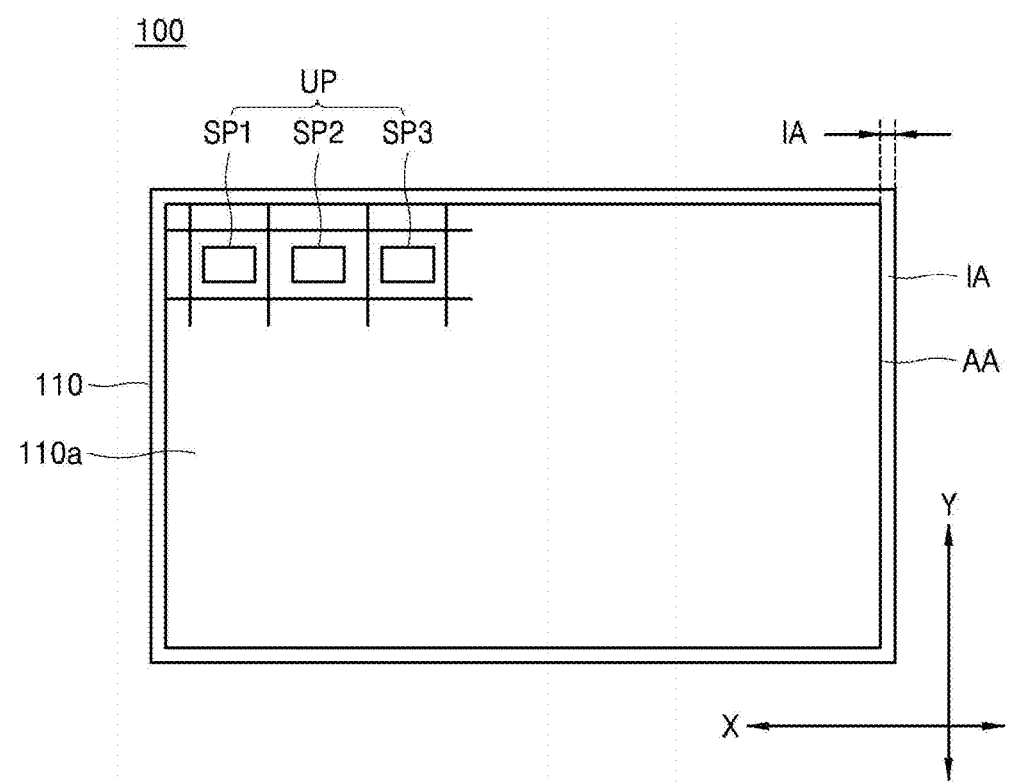

[FIG. 2]
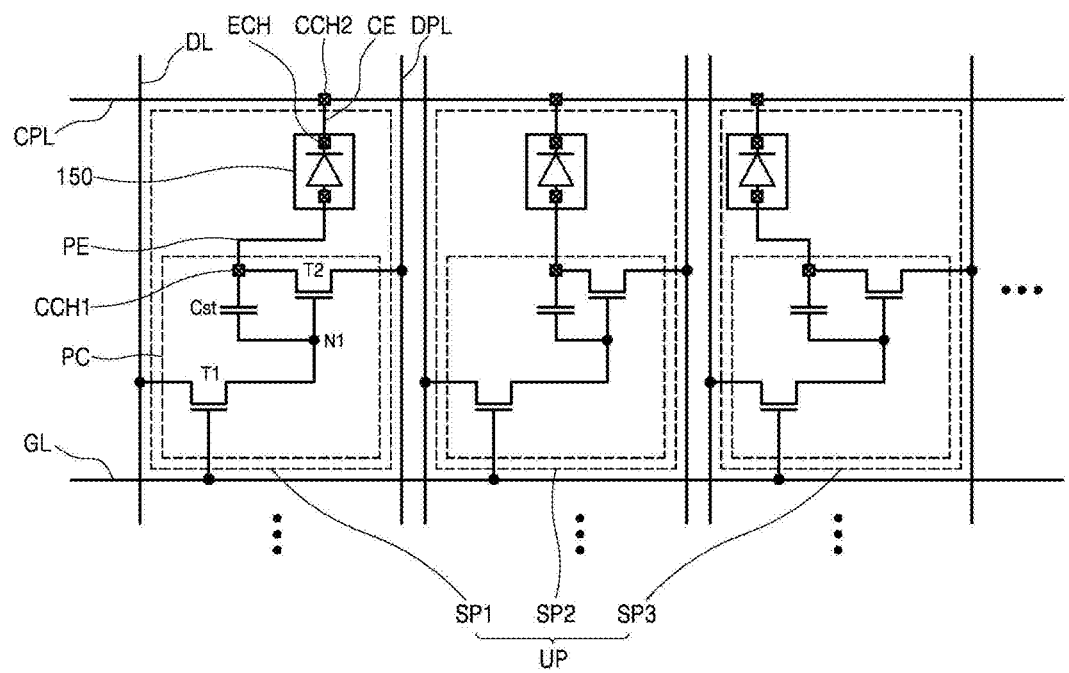
[FIG. 3]
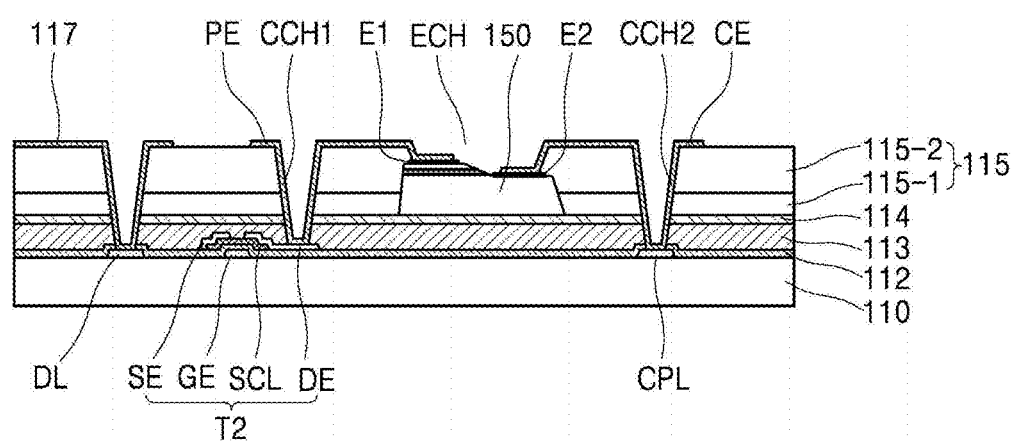

[FIG. 4]
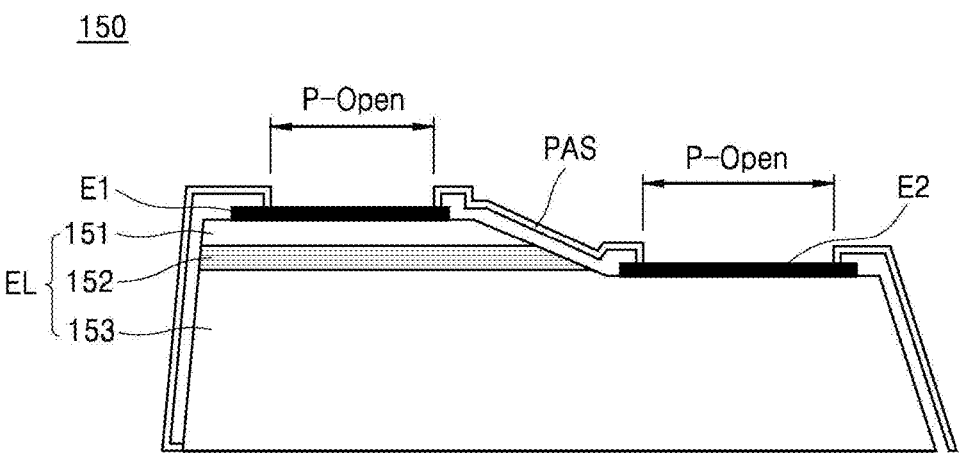
[FIG. 5A]
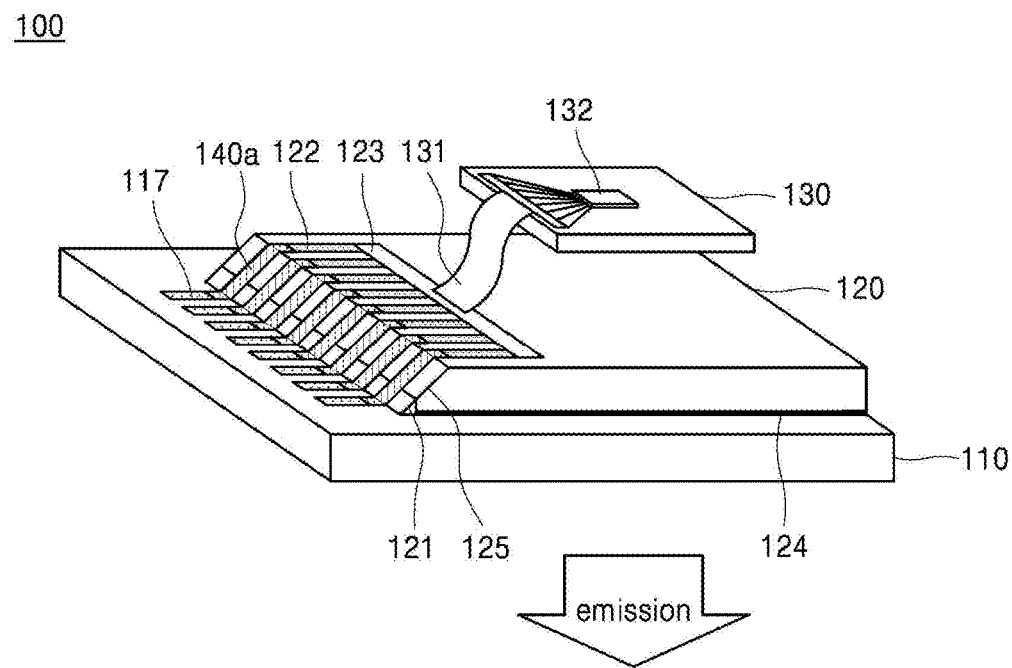

[FIG. 5B]
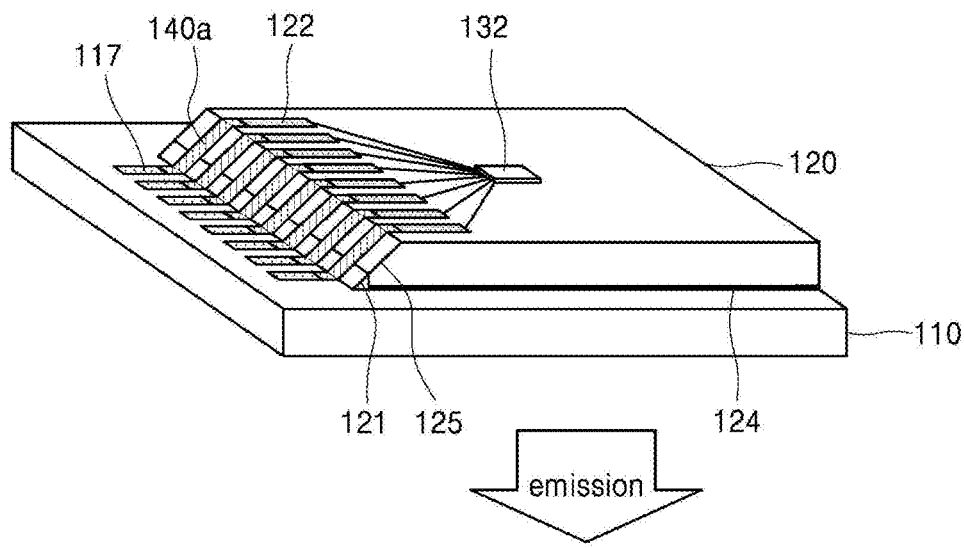
[FIG. 6]
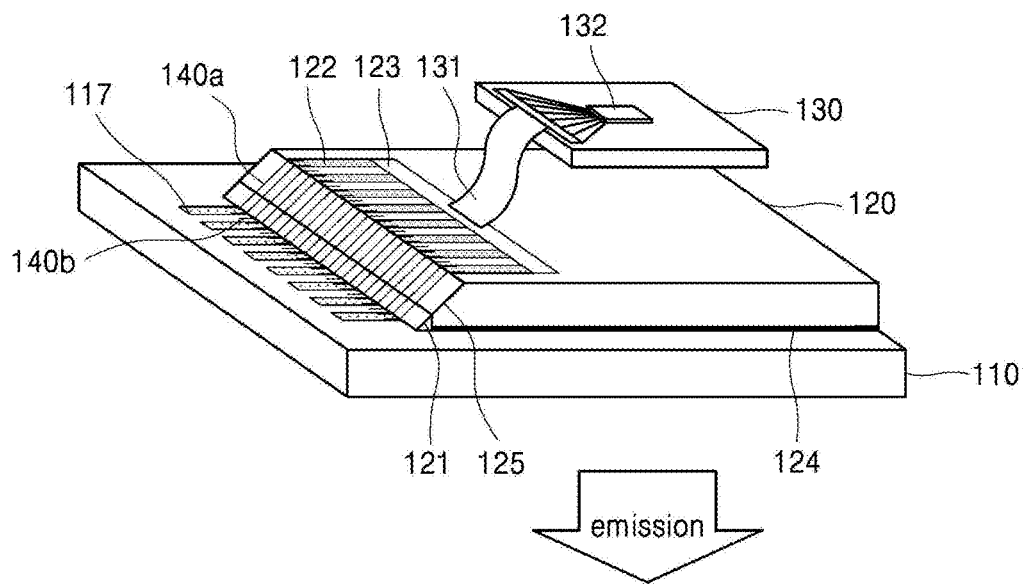

[FIG. 7A]
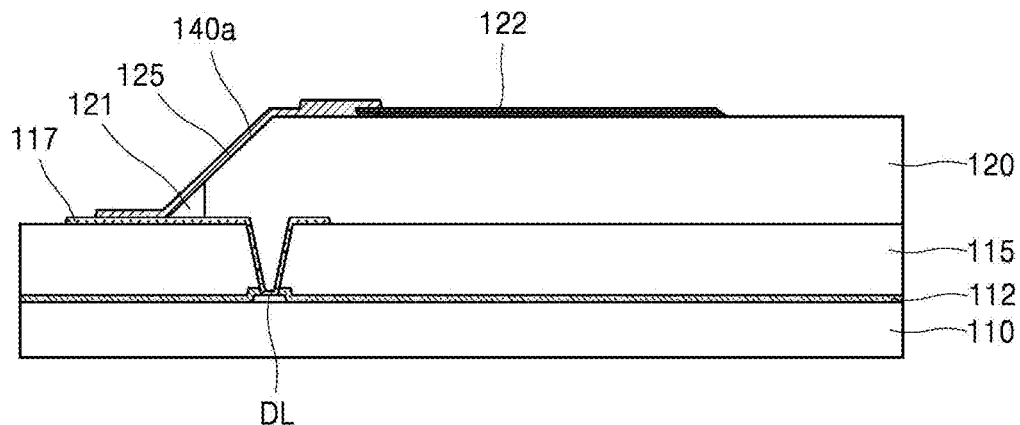
[FIG. 7B]
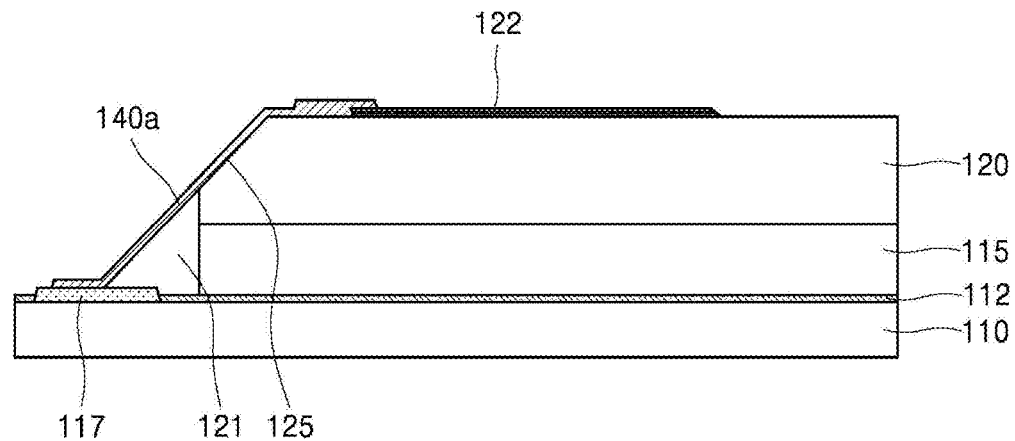
[FIG. 8A]
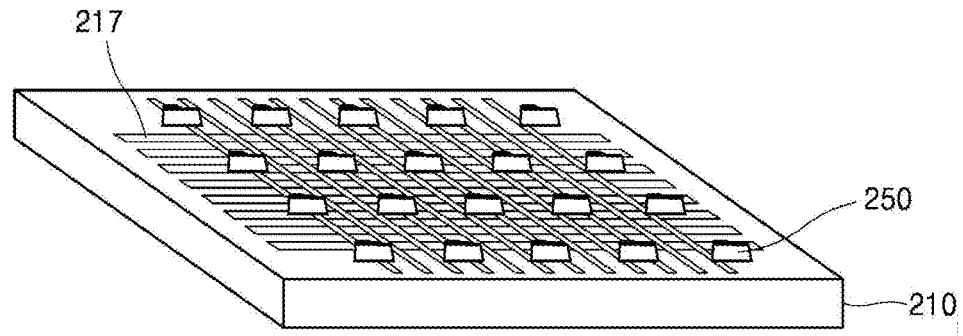

[FIG. 8B]
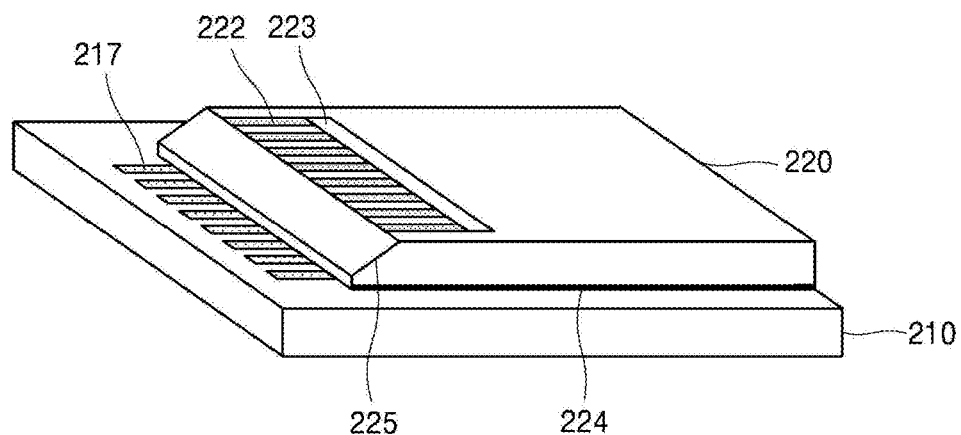
[FIG. 8C]
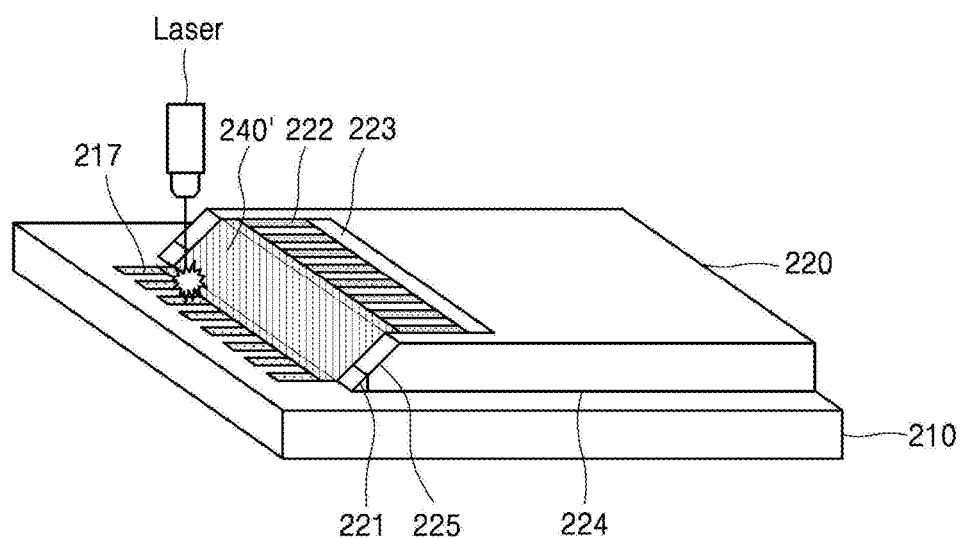

[FIG. 8D]
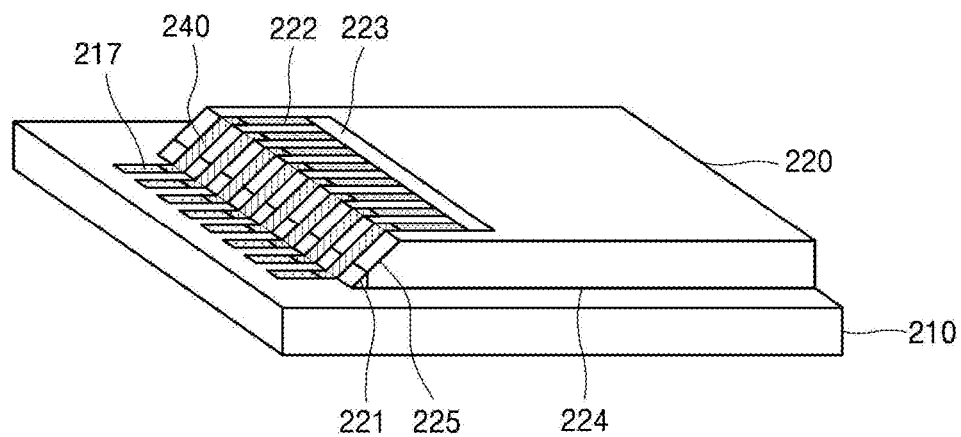
[FIG. 8E]
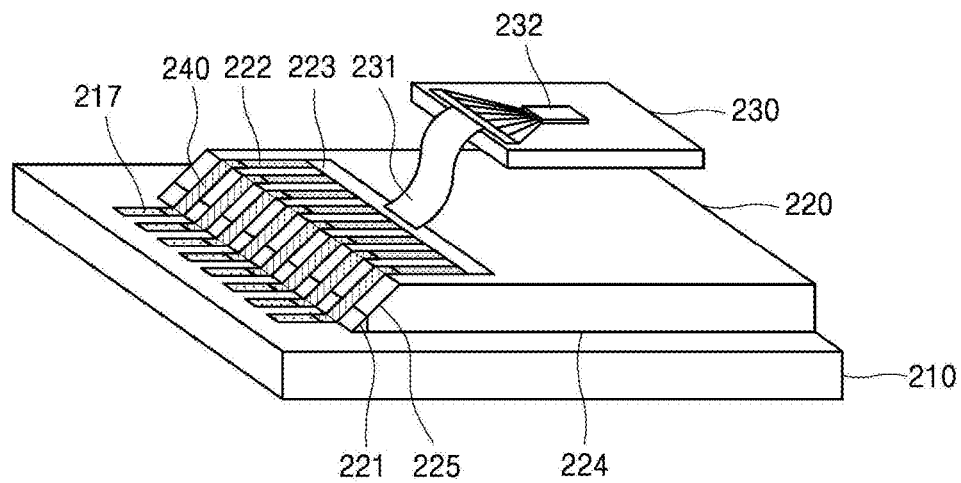

[FIG. 9]
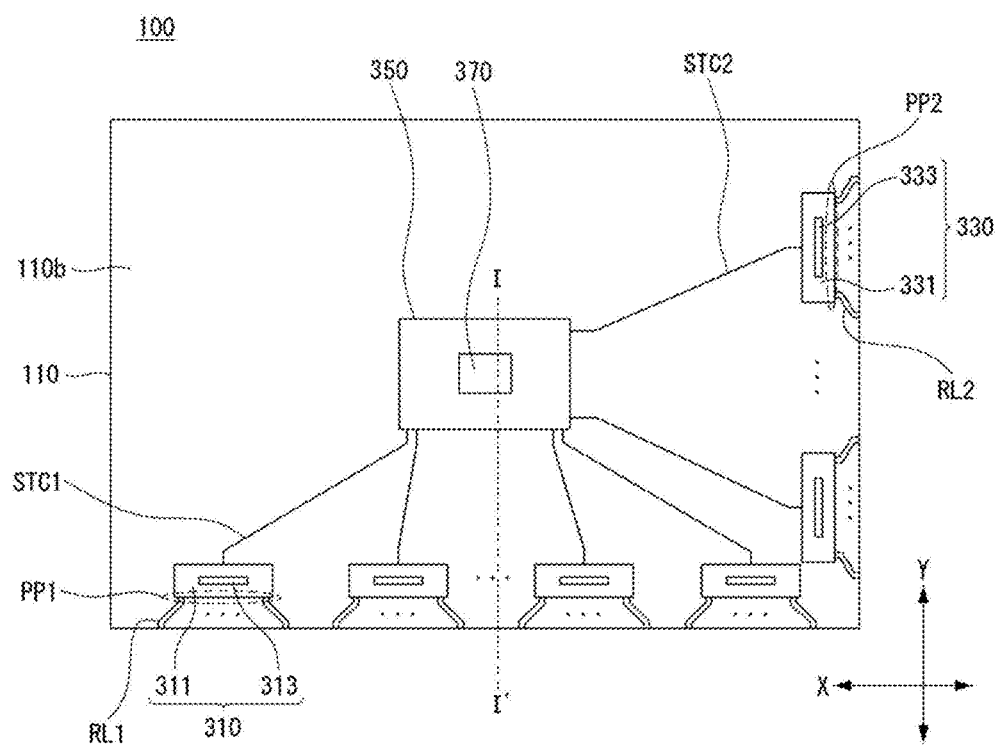

[FIG. 10]
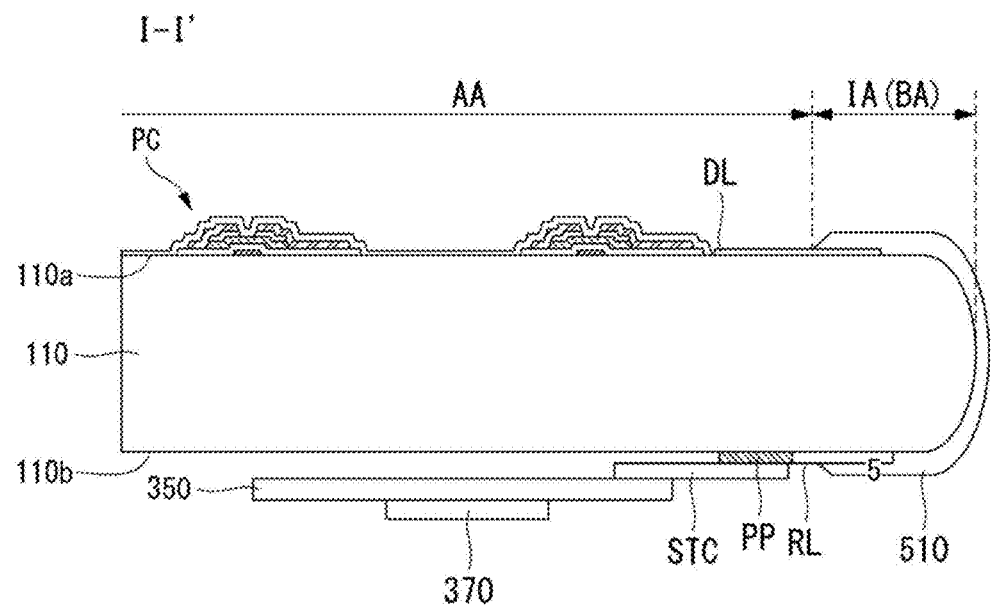
[FIG. 11]
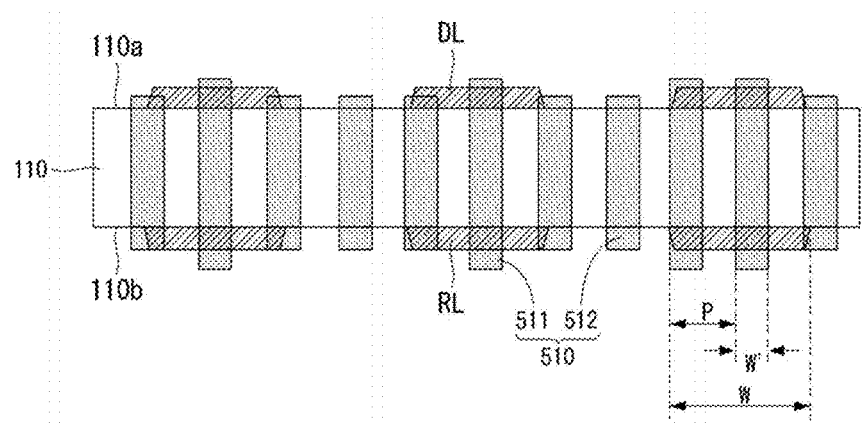

[FIG. 12]
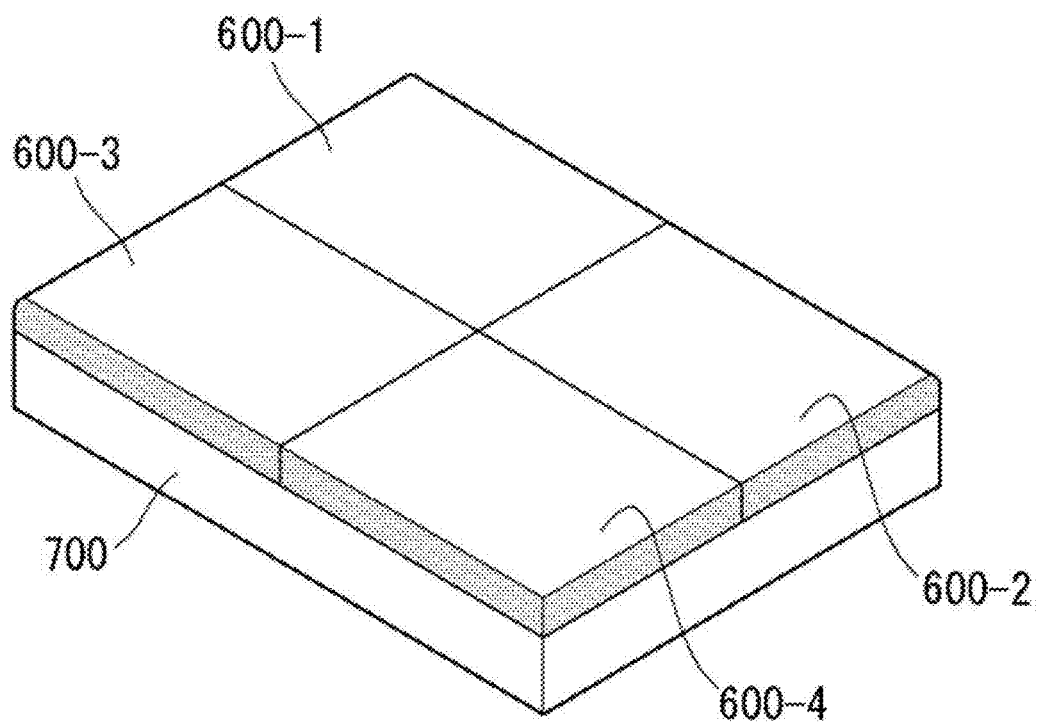

DISPLAY DEVICE AND METHOD FOR FABRICATING THE SAME

CROSS-REFERENCE TO RELATED APPLICATIONS

This application claims the priority of Korean Patent Application No. 10-2017-0083773 filed on Jun. 30, 2017 and Korean Patent Application No. 10-2017-0171254 filed on Dec. 13, 2017, in the Korean Intellectual Property Office, the disclosure of which is hereby incorporated by reference in its entirety.

BACKGROUND

1. Technical Field

The present disclosure relates to a display device and a method for fabricating the same and more specifically, to a display device in which a bezel area that is an inactive area for connecting electrodes on different substrates can be reduced in the connection structure between the wiring electrode and the circuit board, and a method for fabricating the same.

2. Description of the Related Art

A display device is widely used as display screens of a notebook computer, a tablet computer, a smart phone, a portable display device and a portable information device, in addition to display devices of a television or a monitor.

Display devices may be divided into a reflective display device and a light-emitting display device. The reflective display device displays information as natural light or light emitted from an external luminaire is reflected off the display device. The light-emitting display device includes a light-emitting element or a light source therein and displays information by using the light emitted from the light-emitting element or the light source.

The light-emitting element may use a light-emitting element capable of emitting various wavelengths of light, or may use a light-emitting element emitting white or blue light together with a color filter capable of changing the wavelength of emitted light.

As described above, in order to display an image on a display device, a plurality of light-emitting elements is disposed on a substrate of the display device. In order to control each light-emitting element to emit light individually, a driving element for supplying a driving signal or a driving current is disposed on the substrate together with the light-emitting element. The plurality of light-emitting elements disposed on the substrate is analyzed according to the arrangement of information to be displayed, to display the information on the substrate.

In other words, the plurality of pixels is disposed in the display device, and each of the pixels uses a thin-film transistor as a switching element which is a driving element. Each of the pixels is connected to the thin-film transistor and is driven, so that the display device displays images as the pixels are operated individually.

Representative display devices using thin-film transistors include a liquid-crystal display device and an organic light-emitting display device. Among them, a liquid-crystal display device is not a self-luminous display device, and thus it requires a backlight unit disposed under (behind) the liquid-crystal display device to emit light. Such a backlight unit increases the thickness of the liquid-crystal display device. In addition, it is not possible to implement a display device having a variety of shapes such as a flexible or circular display device with such a backlight unit. Moreover, the luminance and response speed may be lowered.

On the other hand, a display device having a self-luminous element can be made thinner than a display device having a light source, and is advantageous for a flexible and foldable display device.

Such a display device having a self-luminous element may be divided into an organic light-emitting display device including an organic material as an emission layer, and a micro-LED display device using a micro-LED element as a light-emitting element. Such a self-luminous display device, such as an organic light-emitting display device and a micro-LED display device, does not require an additional light source, and thus can be used for thin display devices having various shapes.

However, even though an organic light-emitting display device using an organic material does not require an additional light source, there is a problem that a defective pixel may occur due to moisture and oxygen. Accordingly, a variety of technical ideas are additionally required to minimize permeation of oxygen and moisture.

Regarding the above-mentioned problem, research and development on a display device using a micro-sized micro light-emitting diode as a light-emitting element have been progressed recently. Such a light-emitting display device has attracted attention as a next-generation display device because of its high image quality and high reliability.

An LED element is a semiconductor light-emitting element utilizing the property that light is emitted when a current flows in a semiconductor device. Such LED elements are widely employed by luminaires, TVs, a variety of display devices, etc. An LED element is composed of an n-type semiconductor layer, a p-type semiconductor layer, and an active layer therebetween. When a current flows, electrons in the n-type semiconductor layer and holes in the p-type semiconductor layer recombine in the active layer to emit light.

There are several technical requirements for implementing a light-emitting display device employing an LED element as a light-emitting element of a unit pixel. Initially, LED elements are crystallized on a semiconductor wafer substrate such as sapphire or silicon (Si), and the crystallized LED elements are moved to a substrate where a driving element is disposed. In doing so, a sophisticated transfer process for positioning the LED elements at locations corresponding to the respective pixels is required.

Although the LED element may be formed using an inorganic material, it is necessary to crystallizing them. In order to crystallize an inorganic material such as GaN, the inorganic material has to be crystallized on a substrate capable of inducing crystallization. The substrate capable of efficiently inducing crystallization of the inorganic material is a semiconductor substrate. The inorganic material has to be crystallized on the semiconductor substrate as described above.

The process of crystallizing the LED element is also referred to as epitaxy, epitaxial growth or epitaxial process. An epitaxial process refers to growing a film on the surface of a crystal with a specific orientation relationship. In order to form the device structure of an LED element, a GaN compound semiconductor has to be stacked on the substrate in the form of a pn junction diode. At this time, each layer is grown by inheriting the crystallinity of the underlying layer.

A defect inside the crystal acts as a nonradiative center in the electron-hole recombination process. Therefore, in an LED device using photons, the crystallinity of the crystals forming each layer has a great influence on the device efficiency.

Currently, the sapphire substrate is commonly used as the substrate mainly. Recently, research is ongoing into GaN-based substrates.

The price of the semiconductor substrate required for crystallizing the inorganic material such as GaN constituting the LED element on the semiconductor substrate is high. Therefore, when a large amount of LEDs are used as light-emitting pixels of a display device, rather than LEDs as a light source used for simple luminaire or a backlight unit, there is a problem that the production cost is increased.

In addition, as described above, the LED element formed on the semiconductor substrate requires a step of transferring it to the substrate of a display device. In doing so, it is difficult to separate the LED element from the semiconductor substrate. Furthermore, it is more difficult to transplant the separated LED element to a designed location correctly.

In transferring the LED element formed on the semiconductor substrate to a substrate for implementing a display device, a variety of transferring method may be available, including a method of using a polymer-material based substrate such as PDMS, a method of transferring using an electromagnetic force or electrostatic force, or a method of picking and moving one by one, etc. Researches are ongoing into a variety of transferring methods.

Such a transfer process is related to the productivity of the process of fabricating display devices, and thus it would be inefficient to transfer the LED elements one by one for mass production.

Accordingly, a precise transfer process or technique is required, to separate a plurality of LED elements from a semiconductor substrate using a substrate for transfer made of a polymer material to locate them to a substrate of a display device, especially a pad electrode connected to a driving element and a power electrode disposed in a thin-film transistor.

During the above-described transferring process or subsequent processes that follow the transferring process, there may be defects, e.g., the LED element is flipped over while it is moved or transferred depending on conditions such as vibration or heat. There were many difficulties in finding and recovering such defects.

A typical transfer process will be described as an example of a transfer process of an LED element as follows: An LED element is formed on a semiconductor substrate, and an electrode is formed on a semiconductor layer, so that an individual LED element is completed. Subsequently, the semiconductor substrate and a PDMS substrate (hereinafter referred to as a transfer substrate) are brought into contact with each other, to move the LED element to the transfer substrate. The LED element has to be transferred from the semiconductor substrate to the transfer substrate taking into account the pixel pitch among the pixels when they are disposed on an actual display substrate. Therefore, when the transfer substrate has protruded features or the like for receiving the LED elements, the protruded features or the like have to be spaced apart from one another by the pixel pitch.

Subsequently, a laser is irradiated onto the LED element through the rear surface of the semiconductor substrate, thereby separating the LED element from the semiconductor substrate. In the process of irradiating the laser, when the LED element is separated from the semiconductor substrate, the GaN material of the semiconductor substrate may be physically and rapidly expanded due to concentration of the high energy of the laser, possibly resulting in shock. (This is referred to as primary transfer.)

Subsequently, the LED element transferred onto the transfer substrate is transferred onto the substrate of the display device. A passivation layer for insulating/protecting a thin-film transistor is disposed on a substrate, and then an adhesive layer is disposed on the passivation layer.

When the transfer substrate is brought into contact with the substrate of the display device to receive pressure, the LED element transferred onto the transfer substrate is transferred to the substrate of the display device by the adhesive layer on the passivation layer.

If the adhesive force between the transfer substrate and the LED element is smaller than the adhesive force between the substrate of the display device and the LED element, the LED element on the transfer substrate can be transferred to the substrate of the display device easily. (This is referred to as secondary transfer).

The size of the semiconductor substrate is basically different from, and typically smaller than the size of the substrate of the display device. Due to such differences in area and size, the above-described primary and secondary transfer processes are repeated by dividing the substrate of the display device into sub-areas, so that the LED elements can be transferred in the respective pixels of the display device.

The LED elements formed on the semiconductor substrate may be red, blue and green LED elements depending on the type thereof, or may be a white LED element. In the method of implementing pixels of a display device using LED elements emitting light of different wavelengths, the number of times of the primary and secondary transfer processes described above may be further increased.

The LED element is composed of a compound semiconductor such as GaN, and can inject a high current due to the property of the inorganic material, thereby achieving a high luminance. In addition, the LED element has high reliability since it is less affected by the environment such as heat, moisture and oxygen.

In addition, the LED element has an internal quantum efficiency of about 90%, which is higher than that of organic light emitting display devices. Therefore, there are advantages that it can display high luminance images and consume less power.

Further, unlike organic light-emitting display devices, the influence by oxygen and moisture is ignorable in using an inorganic material. Therefore, no additional encapsulation layer or substrate for minimizing permeation of moisture and oxygen is required, and thus it is possible to reduce the inactive area of the display device which is a margin area where an encapsulation layer or substrate is disposed.

However, in order to connect the electrodes disposed on the display device with the circuit board, an area is required to dispose a pad electrode and establish connection between a flexible substrate and the pad electrode. Such an inactive area has to be formed in any of the side surfaces of the display device.

In order to dispose the pad electrode and establish connection with the circuit board, it may be contemplated to extend wirings on the rear surface of the display device. However, there may be several processing issues in disposing the wirings on the side surface or extending the wirings through holes in the substrate.

Recently, many research activities have been conducted to realize a multi-screen display device having multiple display devices connected to one another by reducing the inactive area.

SUMMARY

As described above, in a display device employing LED elements, neither encapsulation layer nor encapsulation substrate is required, and thus the bezel area can be reduced. Therefore, it is advantageous to implement a modular display device using a plurality of display devices. However, since such a modular display device is also required to be connected to a circuit board or a circuit part, it may be difficult to further reduce the inactive area which is the bezel area between the display devices.

Accordingly, embodiments of the present disclosure are directed to a display device and a method for fabricating the same that substantially obviate one or more of the problems due to limitations and disadvantages of the related art.

An object of the present disclosure is to provide a display device having a reduced bezel area that can be employed to implement a modular display device including LED elements, and a method for fabricating the same.

Another object of the present disclosure is to provide a multi-screen display device with reduced boundary between adjacent display devices.

It should be noted that objects of the present disclosure are not limited to the above-described objects, and other objects of the present disclosure will be apparent to those skilled in the art from the following descriptions.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

In accordance with one aspect of the present disclosure, a display device is provided with a reduced bezel area that is an inactive area. A driving element, a light-emitting element and a wiring electrode are disposed on the substrate, and at least a part of the wiring electrode is covered by the circuit board. The connection electrode is connected to the wiring electrode and is extended to the upper surface of the circuit board. One side of the circuit board has a tapered shape, so that the connection electrode can be extended smoothly to the upper surface of the circuit board. In this manner, no separate inactive area is used in connecting the wiring electrodes with the upper surface of the circuit board, and thus the bezel area can be reduced.

In accordance with another aspect of the present disclosure, a method is provided for fabricating a display device with a reduced bezel area. A driving element and a wiring electrode are disposed on a substrate, and then a light-emitting element is disposed on the substrate. The circuit board is attached to the substrate so that it covers at least a part of the wiring electrode, and a side surface of the circuit board has a tapered shape in the region where at least a part of the wiring electrode is opened. Subsequently, a connection electrode connected to the wiring electrode and extended to the upper surface of the circuit board along the tapered shape of the circuit board is provided, thereby reducing the bezel area.

In accordance with another aspect of the present disclosure, there is provided a modular display device or a multi-screen display device. A pixel area is defined by a data electrode and a gate electrode on a substrate. At least one driving element and an LED element connected to the driving element are disposed in the pixel area.

A first electrode, which is a data electrode or a gate electrode, is disposed on the substrate, and is electrically connected to a second electrode on the rear surface of the substrate through a wiring electrode. The wiring electrode is disposed on a side surface of the substrate so that the first electrode and the second electrode are electrically connected to each other. The wiring electrode partially extends from the side surface of the substrate to the front surface and the rear surface of the substrate and is connected to the first electrode and the second electrode.

The wiring electrode may be made up of a plurality of electrodes and may be composed of a mixed material including a conductive material.

According to an exemplary embodiment of the present disclosure, the luminous efficiency of a display device can be improved by employing light-emitting elements having a structure capable of increasing the light-emitting efficiency of the light-emitting elements. In addition, by employing the light-emitting elements, the power consumption of the display device can be saved. In addition, by increasing the number of light-emitting elements that can be taken in a semiconductor device, the production cost can be saved.

According to an exemplary embodiment of the present disclosure, the display device has a wiring electrode connecting the electrodes to the rear surface, the pad portion disposed in the bezel area can be eliminated, thereby reducing or zeroing the bezel area. In addition, in a multi-screen display device according to an exemplary embodiment of the present disclosure, the bezel area is reduced, so that multiple screen modules can display a single seamless image even if the screen modules are connected to one another side-by-side in a lattice shape. Thus, it is possible to improve the quality of the image displayed on the large screen, thereby improving the immersion of viewers in the image.

According to one embodiment, a display device comprises a substrate having a driving element, a light-emitting element and a wiring electrode; a circuit board disposed to cover at least a part of the wiring electrode; and at least one connection electrode connected to the wiring electrode and extended to an upper surface of the circuit board, wherein one side surface of the circuit board corresponding to the path of the connection electrode extending to the upper surface of the circuit board has a tapered shape.

A buffer layer may be provided on the side surface of the circuit board. The buffer layer may have a tapered shape.

A reflective layer may be provided between the circuit board and the substrate.

The wiring electrode may be electrically connected to the at least one connection electrode.

A dummy electrode may be extended from the substrate to the upper surface of the circuit board. The dummy electrode may be disposed between connection electrodes which connect the wiring electrode to the circuit wiring in order to minimize damage due to electrostatic discharging. The dummy electrode or the connection electrode may have one of selected shape from diamond, round, wave and stripe shape.

The circuit board may be a flexible board. At least a part of the circuit board may be attached to the substrate.

A circuit wiring may be provided on the circuit board. The wiring electrode may be electrically connected to the circuit wiring via the connection electrode.

According to another embodiment, a method for fabricating a display device comprises disposing a driving element, a wiring electrode, and a light-emitting element on a substrate; bringing a circuit board having a side surface in a tapered shape into contact with the substrate to cover at least a part of the wiring electrode; and connecting the wiring electrode with a circuit wiring on the circuit board.

The step of bringing the circuit board having the side surface in the tapered shape into contact with the substrate may further comprise bonding the substrate and the circuit board using an adhesive and disposing a buffer layer in a tapered shape on one side surface of the circuit board.

The step of connecting the wiring electrode with the circuit wiring on the circuit board may comprise applying a conductive material so that a part of the wiring electrode is connected to the circuit wiring, and then patterning a connection electrode using a laser.

According to another embodiment, a display device is provided, the display device having a first electrode on a substrate and a second electrode on a rear surface of the substrate, wherein a micro LED element is used as a light-emitting element of a pixel and the first electrode is connected to the second electrode via a plurality of connection electrode pattern implemented as a plurality of fine electrodes on a side surface of the substrate.

Some of the plurality of fine electrodes may be dummy electrodes.

The first electrode may be a gate line or a data line disposed on the substrate.

A circuitry may be connected to the second electrode on the rear surface of substrate.

An insulating layer may be provided on the wiring electrode.

It should be noted that effects of the present disclosure are not limited to those described above and other effects of the present disclosure will be apparent to those skilled in the art from the following descriptions.

The Summary is not to specify essential features of the appended claims, and thus the scope of the claims is not limited thereby.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated and constitute a part of this application, illustrate embodiments of the disclosure and together with the description serve to explain various principles. In the drawings:

FIG. 1 is a schematic plan view of a light-emitting element according to an exemplary embodiment of the present disclosure;

FIG. 2 is a circuit diagram for illustrating a configuration of a unit pixel according to the exemplary embodiment shown in FIG. 1;

FIG. 3 is a cross-sectional view for illustrating the arrangement of a light-emitting element according to an exemplary embodiment of the present disclosure;

FIG. 4 is a cross-sectional view for illustrating a light-emitting element according to an exemplary embodiment of the present disclosure;

FIGS. 5A and 5B are schematic views for illustrating connection between a circuit board and electrodes according to an exemplary embodiment of the present disclosure;

FIG. 6 is a schematic view for illustrating various configurations of connection electrodes according to an exemplary embodiment of the present disclosure;

FIGS. 7A and 7B are schematic cross-sectional views for illustrating the electrical connection relationship of the connection electrodes;

FIGS. 8A to 8E are schematic views for illustrating a method for fabricating a display device according to an exemplary embodiment of the present disclosure;

FIG. 9 is a plan view showing the rear surface of the display device according to the exemplary embodiment shown in FIG. 1;

FIG. 10 is a cross-sectional view taken along line I-I' of FIG. 1;

FIG. 11 is a schematic view for illustrating the connection between the electrodes according to an exemplary embodiment of the present disclosure; and FIG. 12 is a schematic view for illustrating a multi-screen display device using a display device according to an exemplary embodiment of the present disclosure.

DETAILED DESCRIPTION

Advantages and features of the present disclosure and methods to achieve them will become apparent from the descriptions of exemplary embodiments hereinbelow with reference to the accompanying drawings. However, the present disclosure is not limited to exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B" and "an element A next to an element B," another element C may be disposed between the elements A and B unless the term "directly" or "immediately" is explicitly used.

In describing temporal relationship, terms such as "after," "subsequent to," "next to" and "before" are not limited to "directly after," "directly subsequent to," "immediately next to" "immediately before," and so on, unless otherwise specified.

In describing flow of signals, such as "a signal is delivered from node A to node B," a signal may be delivered from node A to node B via another node unless the term "directly" or "immediately" is explicitly used.

The terms first, second, third and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, exemplary embodiments of the present disclosure will be described in detail with reference to the accompanying drawings.

FIG. 1 is a plan view of a light-emitting display device according to an exemplary embodiment of the present disclosure. FIG. 2 is a circuit diagram for illustrating a configuration of a unit pixel according to the exemplary embodiment shown in FIG. 1; Referring to FIGS. 1 and 2, a light-emitting display device 100 according to the exemplary embodiment of the present disclosure includes a substrate 110 on which an active area AA where a plurality of unit pixels UP is disposed, and an inactive area IA are defined.

Each of the unit pixels UP may include a plurality of sub-pixels SP1, SP2 and SP3 on a front face 110a of the substrate 110. Although the sub-pixels SP1, SP2 and SP3 typically may emit red, blue and green light, respectively, this is not limiting. For example, the sub-pixels may include a sub-pixel emitting white light.

The substrate 110 may be a thin-film transistor array substrate made of glass or a plastic material. It may be formed by attaching two or more substrates together or by stacking two or more layers. The inactive area IA may be defined as a region on the substrate 110 except for the active area AA, which may have a relatively very small width and may be defined as a bezel area.

The plurality of unit pixels UP is disposed in the active area AA. The unit pixels UP are arranged in the active area AA such that they have a predetermined first reference pixel pitch along the x-axis direction and have a predetermined second reference pixel pitch along the y-axis direction. The first reference pixel pitch may be defined as the distance between the centers of adjacent unit pixels UP. The second reference pixel pitch may be defined as the distance between the centers of adjacent unit pixels UP in the reference direction, similar to the first reference pixel pitch.

The distance among the sub-pixels SP1, SP2 and SP3 of each unit pixel UP may also be defined as a first reference sub-pixel pitch and a second reference sub-pixel pitch, similar to the first reference pixel pitch and the second reference pixel pitch.

In the light-emitting display device 100 including an LED element 150 as an LED element, the width of the inactive area IA may be smaller than the pixel pitches or the sub-pixel pitches described above. When a multi-screen display device is implemented with the light-emitting display device 100, the width of the inactive area IA is smaller than the pixel pitches or the sub-pixel pitches, and thus it is possible to implement a multi-screen display device having substantially no bezel area.

In order to implement such a multi-screen display device with no or substantially no bezel area, the first reference pixel pitch, a second reference pixel pitch, the first reference sub-pixel pitch and the second reference sub-pixel pitch may be maintained constant in the active area of the light-emitting display device 100. Alternatively, by dividing the active area AA into several sub-areas so that different sub-areas have different pitches, and by making the pixel pitches of the sub-areas adjacent to the inactive area IA are larger than those of the other sub-areas, the size of the bezel area can be made smaller than the pixel pitches.

However, in the light-emitting display device 100 having different pixel pitches, distortion of images may occur. To overcome it, image processing is performed in such a manner that image data is sampled in comparison with adjacent areas in consideration of the pixel pitches. By doing so, the bezel area can be reduced while suppressing the distortion of the image.

However, in reducing the size of the inactive area IA, the minimum area is required for a pad area for connecting to circuitry that supplies power to and transmits/receives data signals to/from the unit pixels UP having the LED elements 150, and an area for a drive IC, etc.

The configuration and circuit structure of the sub-pixels SP1, SP2 and SP3 of each of the unit pixels UP of the light-emitting display device 100 will be described with reference to FIG. 2. Pixel drive lines are provided on the front surface 110a of the substrate 110 and supply necessary signals to each of the plurality of sub-pixels SP1, SP2, and SP3. According to the exemplary embodiment of the present disclosure, the pixel drive lines include a plurality of gate lines GL, a plurality of data lines DL, a plurality of driving power lines DPL, and a plurality of common power lines CPL.

The plurality of gate lines GL is disposed on the front face 110a of the substrate 110 and is extended in a first horizontal axis direction X of the substrate 110 while being spaced apart from one another in a second horizontal axis direction Y.

The plurality of data lines DL is disposed on the front face 110a of the substrate 110 such that they intersect with the gate lines GL and is extended in the second horizontal axis direction Y of the substrate 110 while being spaced apart from one another in the first horizontal axis direction X.

The driving power lines DPL are disposed on the substrate 110 such that they are parallel to the data lines DL and may be formed together with the data lines DL. Each of the driving power lines DPL supplies a pixel driving power provided from an external source to the adjacent sub-pixels SP.

The common power lines DPL are disposed on the substrate 110 such that they are parallel to the gate lines DL and may be formed together with the gate lines GL. Each of the common power lines CPL supplies a common power provided from an external source to the adjacent sub-pixels SP1, SP2 and SP3.

Each of the plurality of sub-pixels SP1, SP2 and SP3 is disposed in a sub-pixel region defined by the respective gate lines GL and data lines DL. Each of the plurality of sub-pixels SP1, SP2, and SP3 may be defined as a minimum unit region from which light is actually emitted.

At least three sub-pixels SP1, SP2 and SP3 adjacent to one another may form a single unit pixel UP for representing a color. For example, a single unit pixel UP may include a red sub-pixel SP1, a green sub-pixel SP2 and a blue sub-pixel SP3 adjacent to one another along the first horizontal axial direction X and may further include a white sub-pixel to improve the luminance.

Optionally, each of the plurality of driving power lines DPL may be disposed in the respective unit pixels UP. Then, at least three sub-pixels SP1, SP2 and SP3 of each of the unit pixels UP share one driving power line DPL. As a result, it is possible to reduce the number of driving power lines for driving the sub-pixels SP1, SP2 and SP3, so that the aperture ratio of each unit pixel UP can be increased by the number of reduced driving power lines, or the size of each unit pixel UP can be reduced.

Each of the plurality of sub-pixels SP1, SP2 and SP3 according to an exemplary embodiment of the present disclosure includes a pixel circuit PC and an LED element 150.

The pixel circuit PC is disposed in a circuit region defined in each of the sub-pixels SP and is connected to the adjacent gate line GL, data line DL and driving power line DPL. The pixel circuit PC controls a current flowing through the LED element 150 according to a data signal from the data line DL in response to a scan pulse from a gate line GL based on a pixel drive power supplied from the driving power line DPL. According to an exemplary embodiment of the present disclosure, the pixel circuit PC includes a switching thin-film transistor T1, a driving thin-film transistor T2, and a capacitor Cst.

The switching thin-film transistor T1 includes a gate electrode connected to a gate line GL, a first electrode connected to a data line DL, and a second electrode connected to a gate electrode N1 of the driving thin-film transistor T2. The first and second electrodes of the switching thin-film transistor T1 may be a source electrode and a drain electrode or vice versa depending on the current direction. The switching thin-film transistor T1 is switched on/off in response to a scan pulse supplied to the gate line GL to supply a data signal supplied to the data line DL to the driving thin-film transistor T2.

The driving thin-film transistor T2 is turned on by the voltage supplied from the switching thin-film transistor T1 and/or the voltage of the capacitor Cst, to control the amount of the current flowing from the driving power line DPL to the LED element 150. To this end, the driving thin-film transistor T2 according to an exemplary embodiment of the present disclosure includes a gate electrode connected to the second electrode N1 of the switching thin-film transistor T1, a drain electrode connected to the driving power line DPL, and a source electrode connected to the LED element 150. The driving thin-film transistor T2 controls the data current flowing from the driving power line DPL to the LED element 150 based on the data signal supplied from the switching thin-film transistor T1, to control the emission of the LED element 150.

The capacitor Cst is disposed in an area where the gate electrode N1 and the source electrode of the driving thin-film transistor T2 overlaps with each other, and stores a voltage corresponding to a data signal supplied to the gate electrode of the driving thin-film transistor T2, to turn on the driving thin-film transistor T2 with the stored voltage.

Optionally, the pixel circuit PC may further include at least one compensating thin-film transistor for compensating for a change in the threshold voltage of the driving thin-film transistor T2, and may further include at least one auxiliary capacitor. The pixel circuit PC may further receive a compensating power such as an initializing voltage depending on the numbers of the thin-film transistors and the auxiliary capacitors. Accordingly, the pixel circuit PC according to the exemplary embodiment of the present disclosure drives the LED element 150 by current driving manner like the sub-pixels of an organic light-emitting display device, and thus the pixel circuit PC can be adapted for a pixel circuit of an organic light-emitting display device known in the art.

The LED element 150 is disposed in each of the plurality of sub-pixels SP1, SP2 and SP3. The LED element 150 is electrically connected to the pixel circuit PC of the sub-pixel SP and the common power line CPL so that it emits light as the current flows therethrough from the pixel circuit PC, i.e., the driving thin-film transistor T2 to the common power line CPL. The LED element 150 according to an exemplary embodiment of the present disclosure may be an optical element or a light-emitting diode chip that emits one of red light, green light, blue light, and white light. The light-emitting diode chip may have, but is not limited to, a scale of 1 to 100 micrometers. A size of the chip may be smaller than the size of the remaining emission region excluding the circuit area occupied by the pixel circuit PC in the sub-pixel area.

FIG. 3 is a cross-sectional view illustrating an arrangement of a light-emitting element according to an exemplary embodiment of the present disclosure. Hereinafter, description will be made with reference to FIG. 3 in conjunction with FIGS. 1 and 2.

Each of the sub-pixels SP1, SP2 and SP3 of the display device according to an exemplary embodiment of the present disclosure includes a passivation layer 113, an LED element 150, planarization layers 115-1 and 115-2, a pixel electrode PE, and a common electrode CE.

Although the substrate 110 is shown as being relatively thin in FIG. 3, the substrate 110 may be much thicker than the overall thickness of the layer structure formed on the substrate 110. The substrate 110 may be made up of a plurality of layers or may be formed by attaching a plurality of substrates together.

The pixel circuit PC includes a switching thin-film transistor T1, a driving thin-film transistor T2, and a capacitor C. The pixel circuit PC is identical to that described above; and, therefore, the redundant description will be omitted. Hereinafter, the structure of the driving thin-film transistor T2 will be described by way of example.

The driving thin-film transistor T2 includes a gate electrode GE, a semiconductor layer SCL, a source electrode SE, and a drain electrode DE.

The gate electrode GE is disposed on the substrate 110 together with the gate line GL. The gate electrode GE is covered by the gate insulating layer 112. The gate insulating layer 112 may be made up of a single layer or multiple layers made of inorganic material, for example, silicon oxide (SiOx) and silicon nitride (SiNx).

The semiconductor layer SCL is disposed on the gate insulating layer 112 in a predetermined pattern (or in the form of an island) such that it overlaps with the gate electrode GE. The semiconductor layer SCL may be made of, but is not limited to, a semiconductor material composed of one of amorphous silicon, polycrystalline silicon, oxide, and organic material.

The source electrode SE is disposed such that it overlaps with one side of the semiconductor layer SCL. The source electrode SE is disposed together with the data line DL and the driving power line DPL.

The drain electrode DE is disposed such that it overlaps with the other side of the semiconductor layer SCL and spaced apart from the source electrode SE. The drain electrode DE is disposed together with the source electrode SE and branches off or protrudes from an adjacent driving power line DPL.

In addition, the switching thin-film transistor T1 of the pixel circuit PC is disposed with the same structure as the driving thin-film transistor T2. At this time, the gate electrode of the switching thin-film transistor T1 branches off or protrudes from the gate line GL. The first electrode of the switching thin-film transistor T1 branches off or protrudes from the data line DL. The second electrode of the switching thin-film transistor T1 is connected to the gate electrode GE of the driving thin-film transistor T2 through a via hole formed in the gate insulating layer 112.

The passivation layer 113 is formed over the entire surface of the substrate 110 such that it covers the sub-pixel SP, i.e., the pixel circuit PC. The passivation layer 113 protects the pixel circuit PC and provides a flat surface. The passivation layer 113 may be made of an organic material such as benzocyclobutene or photo-acryl. Preferably, the passivation layer 113 may be made of a photo-acrylic material for a general process.

The LED element 150 according to an exemplary embodiment of the present disclosure may be disposed on the passivation layer 113 by using an adhesive member 114. Alternatively, the LED element 150 may be disposed in a recess formed in the passivation layer 113. When the LED element is disposed in the recess, an inclined surface of the passivation layer 113 may lead the light emitted from the LED element 150 in a particular direction to improve the luminous efficiency.

The LED element 150 is electrically connected to the pixel circuit PC and the common power line CPL so that it emits light as the current flows therethrough from the pixel circuit PC, i.e., the driving thin-film transistor T2 to the common power line CPL. The LED element 150 according to an exemplary embodiment of the present disclosure includes an emission layer EL, a first electrode (or an anode terminal) E1, and a second electrode (or a cathode terminal) E2.

The LED element 150 emits light as electrons and holes recombine according to the current flowing between the first electrode E1 and the second electrode E2.

The planarization layers 115-1 and 115-2 are disposed on the passivation layer 113 such that it covers the LED element 150. Specifically, the planarization layers 115-1 and 115-2 are disposed on the passivation layer 113 with a sufficient thickness to cover the entire surface of the passivation layer 113, i.e., the LED element 150 and the rest of the front surface.

The planarization layers 115-1 and 115-2 may be made up of a single layer. Alternatively, the planarization layers 115-1 and 115-2 may be made up of multi-layer structure including the first planarization layer 115-1 and the second planarization layer 115-2, as shown in the drawings.

The planarization layers 115-1 and 115-2 provide a flat surface over the passivation layer 113. In addition, the planarization layers 115-1 and 115-2 serve to fix the position of the LED element 150.

The pixel electrode PE connects the first electrode E1 of the LED element 150 to the drain electrode DE of the driving thin-film transistor T2. The first electrode E1 may be connected to the source electrode SE depending on the configuration of the thin-film transistor T2. The pixel electrode PE may be defined as an anode electrode. The pixel electrode PE according to an exemplary embodiment of the present disclosure is disposed on the front surfaces of the planarization layers 115-1 and 115-2 overlapping the first electrode E1 of the LED element 150 and the driving thin-film transistor T2. The pixel electrode PE is electrically connected to the drain electrode DE or the source electrode of the driving thin-film transistor T2 through a first circuit contact hole CCH1 formed in the passivation layer 113 and the planarization layers 115-1 and 115-2, and is electrically connected to the first electrode E1 of the LED element 150 through an electrode contact hole ECH formed in the planarization layers 115-1 and 115-2. Accordingly, the first electrode E1 of the LED element 150 is electrically connected to the drain electrode DE or the source electrode SE of the driving thin-film transistor T2 through the pixel electrode PE.

Although the drain electrode DE is connected to the pixel electrode PE in the foregoing description, the source electrode SE may also be connected to the pixel electrode PE, as desired by those skilled in the art.

The pixel electrode PE may be made of a transparent conductive material if the display device is of a top emission type and may be made of a reflective conductive material if the display device is of a bottom emission type. The transparent conductive material may be, but is not limited to, indium tin oxide (ITO), indium zinc oxide (IZO), etc. The reflective conductive material may be, but is not limited to, Al, Ag, Au, Pt or Cu. The pixel electrode PE made of the reflective conductive material may be made up of a single layer including the reflective conductive material or multiple layers formed by stacking the single layer one on another.

The common electrode CE electrically connects the second electrode E2 of the LED element 150 with the common power line CPL and may be defined as a cathode electrode. The common electrode CE is disposed on the front surface of the planarization layers 115-1 and 115-2 overlapping the common power line CPL while overlapping the second electrode E2 of the LED element 150. The common electrode CE may be made of the same material as the pixel electrode PE.

According to an exemplary embodiment of the present disclosure, one side of the common electrode CE is electrically connected to the common power line CPL through a second circuit contact hole CCH2 formed in the gate insulating layer 112, the passivation layer 113 and planarization layers 115-1 and 115-2 overlapping the common power line CPL. The other side of the common electrode CE is electrically connected to the second electrode E2 of the LED element 150 through an electrode contact hole ECH formed in the planarization layers 115-1 and 115-2 overlapping the second electrode E2 of the LED element 150. Accordingly, the second electrode E2 of the LED element 150 is electrically connected to the common power line CPL through the common electrode CE.

According to an exemplary embodiment of the present disclosure, the pixel electrode PE and the common electrode CE may be formed together by an electrode patterning process using a deposition process to deposit an electrode material on the planarization layers 115-1 and 115-2 including the first and second circuit contact holes CCH1 and CCH2 and the electrode contact hole ECH, a photolithography process and an etch process. Accordingly, according to an exemplary embodiment of the present disclosure, the pixel electrode PE and the common electrode CE connecting the LED element 150 to the pixel circuit PC can be disposed at the same time, such that the electrode connecting process can be simplified. In addition, the processing time for connecting the LED element 150 to the pixel circuit PC can be greatly shortened and the productivity of the display device can be improved.

In the display device according to an exemplary embodiment of the present disclosure, the LED element 150 mounted in each of the sub-pixels SP may be fixed by the adhesive member 114.

The adhesive member 114 primarily fixes the LED element 150 of each of the sub-pixels SP. According to an exemplary embodiment of the present disclosure, the adhesive member 114 is in contact with the bottom of the LED element 150. It prevents the dislocation of the LED element 150 during the mounting process and can facilitate the LED element 150 smoothly separated from an intermediate substrate used for transplanting, thereby minimizing defects in the process of transplanting the LED element 150.

According to an exemplary embodiment of the present disclosure, the adhesive member 114 may be attached under the LED element 150 by being dotted on each of the sub-pixels SP and spread by the pressing force applied in the mounting process of the light-emitting element. Accordingly, the position of the LED element 150 can be primarily fixed by the adhesive member 114. Therefore, according to the exemplary embodiment of the present disclosure, the mounting process of the light-emitting element is performed by simply attaching the LED element 150 to the surface, so that the time taken for the mounting process of the light-emitting element can be greatly shortened.

The adhesive member 114 is interposed between the passivation layer 113 and the planarization layers 115-1 and 115-2 and interposed between the LED element 150 and the passivation layer 113. According to another example, the adhesive member 114 is coated on the entire surface of the passivation layer 113 generally at an even thickness, but a part of the adhesive member 114 where contact holes are to be formed may be removed when the contact holes are formed. Accordingly, according to an exemplary embodiment of the present disclosure, the adhesive member 114 is coated on the entire front surface of the passivation layer 113 at an even thickness immediately before the mounting process of the light-emitting element, thereby shortening the processing time for disposing the adhesive member 114.

According to an exemplary embodiment of the present disclosure, the adhesive member 114 is disposed over the entire front surface of the passivation layer 113, such that the planarization layers 115-1 and 115-2 of this example cover the adhesive member 114.

According to another exemplary embodiment of the present disclosure, there is a recess for separately accommodating the LED element 150, which may be attached inside the recess by the adhesive member 114. However, the recess for accommodating the LED element 150 described above may be eliminated depending on process conditions for implementing the display device.

According to an exemplary embodiment of the present disclosure, the mounting process of the light-emitting element may include a process of mounting a red light-emitting element in each of the red sub-pixels SP1, a process of mounting a green light-emitting element in each of the green sub-pixels SP2, and a process of mounting a blue light-emitting element in each of the blue sub-pixels SP3, and may further include a process of mounting a white light-emitting element in each of the white sub-pixels.

According to an exemplary embodiment of the present disclosure, the mounting process may include only a process of mounting a white light-emitting element in each of the sub pixels. In this case, the substrate 110 includes a color filter layer overlapping each sub pixel. The color filter layer transmits only light having a wavelength of a color corresponding to the respective sub-pixel among the white light.

According to an exemplary embodiment of the present disclosure, the mounting process may include only a process of mounting a light-emitting element of a first color in each of the sub pixels. In this case, the substrate 110 includes a wavelength converting layer and a color filter layer overlapping each sub-pixel. The wavelength converting layer emits light of a second color based on a part of the light of the first color incident from the light-emitting element. The color filter layer transmits only light having a wavelength of a color corresponding to the respective sub-pixel among the white light produced from mixture of the light of the first color and the light of the second color. The first color may be blue and the second color may be yellow. The wavelength converting layer may include a phosphor or quantum dots that emits the light of the second color based on the light of the first color.

FIG. 4 is a cross-sectional view for illustrating a light-emitting element according to an exemplary embodiment of the present disclosure.

According to an exemplary embodiment of the present disclosure, an LED element 150 includes an emission layer EL, a first electrode E1, a second electrode E2 and a dielectric layer PAS. The emission layer EL includes a first semiconductor layer 151, an active layer 152 and a second semiconductor layer 153. The LED element 150 emits light as electrons and holes recombine according to the current flowing between the first electrode E1 and the second electrode E2.

The first semiconductor layer 151 may be a p-type semiconductor layer and the second semiconductor layer 153 may be an n-type semiconductor layer, respectively. In the following description, they are referred to as the first and second semiconductor layers 151 and 153, for convenience of illustration. In addition, the first electrode E1 and the second electrode E2 may be referred to as a p-type electrode or an n-type electrode depending on the electrical connection relation, i.e., depending on a semiconductor layer which forms the electrical connection. However, they may be referred to as the first electrode and the second electrode, respectively, for convenience of illustration. In addition, in the following description, the first semiconductor layer 151 and the second semiconductor layer 153 will be described as a p-type semiconductor layer and an n-type semiconductor layer, respectively. On the contrary, the first semiconductor layer 151 and the second semiconductor layer 153 may be an n-type semiconductor layer and a p-type semiconductor layer, respectively.

The first semiconductor layer 151 is disposed on the active layer 152 to provide holes into the active layer 152. According to an exemplary embodiment of the present disclosure, the first semiconductor layer 153 may be made of a p-GaN semiconductor material. The p-GaN semiconductor material may be GaN, AlGaN, InGaN, or AlInGaN. As the impurities used for doping the second semiconductor layer 153, Mg, Zn, Be, etc. may be used.

The second semiconductor layer 153 provides electrons into the active layer 152. According to an exemplary embodiment of the present disclosure, the second semiconductor layer 153 may be made of a n-GaN semiconductor material. The n-GaN semiconductor material may be GaN, AlGaN, InGaN, or AlInGaN. As impurities used for doping the second semiconductor layer 153, Si, Ge, Se, Te, C, etc. may be used.

The active layer 152 is disposed on the second semiconductor layer 153. The active layer 152 has a multi-quantum well (MQW) structure having a well layer and a barrier layer having a higher bandgap than that of the well layer. According to an exemplary embodiment of the present disclosure, the active layer 152 may have a multiple quantum well structure such as InGaN/GaN.

The first electrode E1 is electrically connected to the first semiconductor layer 151 and is connected to the drain electrode DE or the source electrode SE of the driving transistor T2 as a driving thin film pixel. The second electrode E2 is connected to the common power line CPL.

The first electrode E1 may be a p-type electrode, and the second electrode E2 may be an n-type electrode. The type of the first electrode E1 and the second electrode E2 may be determined depending on whether they supply electrons or holes, i.e., whether they are electrically connected to the p-type semiconductor layer or the n-type semiconductor layer. In the following description, however, they are referred to as the first electrode E1 and the second electrode E2 for convenience of illustration.

Each of the first and second electrodes E1 and E2 according to an exemplary embodiment of the present disclosure may be made of a metal material such as Au, W, Pt, Si, Ir, Ag, Cu, Ni, Ti or Cr or at least one alloy thereof. According to another exemplary embodiment of the present disclosure, each of the first and second electrodes E1 and E2 may be made of a transparent conductive material. The transparent conductive material may be, but is not limited to, indium tin oxide (ITO) or indium zinc oxide (IZO).

The dielectric layer PAS is disposed to cover the exterior of the LED element 150 and has an dielectric layer open region P-Open to open at least a part of the first electrode E1 and the second electrode E2. The dielectric layer PAS may be made of a material such as SiNx and SiOx and is disposed to cover the active layer 152.

The dielectric layer PAS works to prevent undesirable electrical connection between the elements when the first electrode E1 and the second electrode E2 of the LED element 150 are electrically connected to the pixel electrode PE or the common electrode CE.

In addition, the second semiconductor layer 153, the active layer 152 and the first semiconductor layer 151 may be sequentially stacked on a semiconductor substrate to form the LED element 150. The semiconductor substrate includes a semiconductor material such as a sapphire substrate or a silicon substrate. This semiconductor substrate may be used as a substrate for growing each of the second semiconductor layer 153, the active layer 152 and the first semiconductor layer 151, and then may be separated from the second semiconductor layer 153 via a substrate separating process. The substrate separating process may be a laser lift-off or chemical lift-off process. Accordingly, as the semiconductor substrate for growth is removed from the LED element 150, the LED element 150 may have a relatively small thickness and may be accommodated in each sub-pixel SP.

FIGS. 5A and 5B are schematic views for illustrating connection between a circuit board and electrodes according to an exemplary embodiment of the present disclosure.

Referring to FIGS. 5A and 5B in conjunction with FIGS. 1 to 4, the display device 100 may include a substrate 110 having wiring electrodes 117 and a circuit board 120 having circuit wirings 122. The circuit board 120 may be integrated with a control chip 132 or may further include a control board 130 having a separate control chip 132.

The LED element 150 and the driving thin-film transistor T2 are disposed on the substrate 110 and are electrically connected to receive a driving signal and a current via the wiring electrodes 117. The wiring electrodes 117 may be made of the same material as the pixel electrode PE, the common electrode CE or the electrodes of the driving thin-film transistor T2 on the substrate 110.

The circuit board 120 includes a plurality of circuit wirings 122 and a pad 123. As shown in FIG. 5A, when the control board 130 having the control chip 132 is separately provided, the pad 123 is electrically connected to the control chip 132 on the control board 130 via a flexible substrate 131.

As shown in FIG. 5B, when the control chip 132 is on the circuit board 120, the control chip 132 may be directly connected to the circuit wirings 122 on the circuit board 120.

The circuit board 120 is in contact with the substrate 110 such that it covers the wiring electrodes 117 partially, leaving a part of the wiring electrodes 117 open. The circuit board 120 has an inclined surface 125 in a tapered shape. The circuit board 120 may be a flexible board and at least a part of the circuit board 120 may be attached to the substrate 110.

Connection electrodes 140a that electrically connect the circuit wirings 122 with the wiring electrodes 117 are disposed on the inclined surface 125 which is a side surface of the circuit board 120, so that the connection electrodes 140a are not disconnected.

The display device may further include a buffer layer 121 on a side surface where the circuit board 120 is in contact with the substrate 110 so as to reduce the step difference between the inclined surface 125 of the circuit board 120 and the substrate 110.

The buffer layer 121 supports the connection electrodes 140a connecting the wiring electrodes 117 with the circuit wirings 122 and reduces the step difference between the circuit board and the substrate so that cracks do not occur in the connection electrodes 140a. As a result, it is possible to suppress defects due to disconnection of the electrodes and to provide stability in the electrical connection.

The display device 100 is of a bottom-emission type that emits light toward the bottom of the substrate 110 and may further include a reflective layer 124 between the circuit substrate 120 and the substrate 110 to increase the luminous efficiency.

The wiring electrodes 117 may be electrodes such as a data line DL and a gate line GL and may be electrodes between pixels. Since the wiring electrodes 117 are connected to the circuit wirings 122 on the circuit board 120 via the connection electrodes 140a, no separate pad area is necessary for disposing a pad for connecting to the circuit board 120 or the like, thereby reducing the bezel area which is the inactive area.

FIG. 6 is a schematic view for illustrating various configurations of connection electrodes according to an exemplary embodiment of the present disclosure. In disposing the connection electrodes 140a on the inclined surface 125 of the circuit board 120 formed in the tapered shape, it may be difficult to align the circuit wirings 122 with the wiring electrodes 117 to electrically connect them.

That is, it is difficult to align the substrate 110 with the circuit board 120 so that the circuit wirings 122 are connected to the wiring electrodes 117, respectively, and to dispose the connection electrodes 140a. In view of the above, by implementing the connection electrodes 140a in a pattern of fine electrodes and disposing them on the inclined surface 125, the circuit wirings 122 and the wiring electrodes 117 are electrically connected by at least one connection electrode 140a. A pattern of fine electrodes may include connection electrodes 140a having a smaller width and a smaller separation distance between each other than the wiring electrodes 117 and/or the circuit wirings 122.

When the connection electrodes 140a in the pattern of fine electrodes are disposed on the inclined surface 125, at least one electrode between the connection electrodes 140a may be a dummy electrode 140b not associated with any connection. The dummy electrode 140b can reduce the influence by static electricity or the like between the connection electrodes 140a of the pattern. In other words, the dummy electrode 140b can minimize damage due to electrostatic discharging between connection electrodes 140a which connect the wiring electrodes 117 to the circuit wiring 122. The dummy electrode 140b or the connection electrode 140a may have one of selected shape from diamond, round, wave and stripe shape.

FIGS. 7A and 7B are schematic cross-sectional views for illustrating the electrical connection relationship of the connection electrodes.

As described above, the connection electrodes 140a are disposed on the inclined surface 125 on one side surface of the circuit board 120 to electrically connect the wiring electrodes 117 with the circuit wirings 122, and the buffer layer 121 may be further included.

In the above-described configuration, various elements including the LED element 150 are disposed on the surface of the substrate 110 covered by the circuit board 120, and the planarization layer 115 is disposed over the elements, such that the wiring electrodes 117 may be disposed on the planarization layer 115 to be connected to the connection electrodes 140a. To this end, a contact hole may be further formed on the planarization layer 115 for connection with electrodes under the planarization layer 115, such as the data line DL.

Alternatively, the wiring electrodes 117 may be disposed on the substrate 110 under the planarization layer 115, i.e., adjacent to the substrate 110. At least a part of the planarization layer 115 is removed, and the resulting step difference as well as the step difference of the circuit board 120 are covered by disposing the buffer layer 121 along the inclined surface 125. Accordingly, the step differences by the circuit board and the planarization layer 115 are reduced, such that the connection electrode 140a can be disposed.

As such, the buffer layer 121 is disposed along the path of the connection electrodes 140a so that the connection electrodes 140a are extended to the upper surface of the circuit board 120. In this manner, the wiring electrodes 117 disposed adjacent to the substrate 110 may be electrically connected to the circuit wirings 122 by the connection electrodes 140a.

As described above, in order to connect the substrate 110 having the wiring electrodes 117 thereon with the circuit wirings 122 on the circuit board 120, the connection electrodes 140a are disposed on the inclined surface 125 having the tapered shape on one side of the circuit board 120, such that it is not necessary to dispose a pad or the like for electrical connection between the substrate 110 and the circuit board 120. As a result, it is possible to provide the display device 100 with reduced bezel area which is the inactive area.

FIGS. 8A to 8E are schematic views for illustrating a method for fabricating a display device according to an exemplary embodiment of the present disclosure.

The wiring electrodes 217 and the LED elements 250 are disposed on the substrate 210. The wiring electrodes 217 may be data lines, gate lines, or wirings for supplying power, and may be electrodes connected to the driving thin-film transistors. The LED elements 250 are formed on a semiconductor substrate and are transferred and disposed on the substrate 210.

Subsequently, the circuit board 220 having the inclined surface 225 in a tapered shape on one side thereof is disposed on the substrate 210 such that it covers at least a part of the wiring electrodes 217.

The disposing the circuit board 220 may include processing the circuit board 220 by grinding or the like so that one side surface thereof has the inclined surface 225, and disposing the circuit wirings 222 and a pad 223 on the circuit board 220.

In addition, the disposing the circuit board 220 may further include disposing the reflective layer 224 on the substrate 210, disposing an adhesive layer for fixing the substrate 210 and the circuit board 220, pressing the circuit board 220, and irradiating heat or light to cure and attach it.

Subsequently, a conductive material 240' is applied so that it covers at least a part of the inclined surface 225 and the circuit wirings 222 while covering at least a part of the wiring electrodes 217. Then, laser is irradiated to cure the conductive material 240' as the connection electrodes 240. The uncured portion of the conductive material 240' is removed to pattern the connection electrodes 240.

The conductive material 240' is a material containing copper (Cu). The region irradiated with the laser is cured and patterned. The region where the laser is not irradiated is a material which can be removed using a solution such as dichlorobenzene and may be a solution containing Cu-based nanoparticles.

The applying and patterning the conductive material 240' may further include disposing the buffer layer 221 so as to reduce the step difference of the inclined surface 225 of the circuit board 220. The buffer layer 221 may be made of a photocurable resin or a non-conductive polymer material.

The irradiating the conductive material 240' with a laser to pattern the connection electrodes 240 and electrically connecting the wiring electrodes 217 with the circuit wirings 222 may include moving and adjusting a laser with respect to the positions of the wiring electrodes 217 and the circuit wirings 222. By adjusting the moving path of the laser to irradiate the conductive material 240' disposed on the inclined surface 225 with it, the connection electrodes 240 may be disposed as electrodes having a diagonal line or a straight line pattern on the inclined plane 225.

Subsequently, the method may further include connecting the control board 230 with the control chip 232 to the pad 223. The pad 223 and the control board 230 may be connected to a flexible board 231. To this end, the method may further include pressing using a conductive ball.

As described above, the circuit wirings 222 on the circuit board 220 are connected to the wiring electrodes 217 via the connection electrodes 240, such that the circuit board 220 having the inclined surface 225 is attached to the substrate 110 and the connection electrodes 240 are disposed on the inclined surface 225 to connect the electrodes, thereby providing a display device with a reduced bezel area.

Referring to FIG. 9, the display device 100 may further include a display driving circuitry on the rear surface 110b of the substrate 110, including a plurality of first pad portions PP1, a plurality of first routing lines RL1, a plurality of second pad portions PP2, a plurality of second routing lines RL2, a data driving circuit 310, a gate driving circuit 330, a control board 350 and a timing controller 370.

The first pad portions PP1 are disposed on the first edge of the rear surface of the substrate 110 such that they are spaced apart from one another at a regular spacing. Each of the first pad portions PP1 includes a plurality of first pads.

The first routing lines RL1 are electrically connected to a plurality of pixel driving lines disposed on the front surface 110a of the substrate 110, more specifically, ends of the plurality of data lines DL, and are extended to the side surfaces and the rear surface of the substrate 110 in the inactive area of the substrate 110 to be electrically connected to the first pad portions PP1. That is, each of the plurality of first routing lines RL1 is provided to surround the outer side surface of the first side of the substrate 110. One end thereof is connected to the plurality of data lines DL in the inactive area IA of the substrate 110, and the other end thereof is connected to the first pads of the respective first pad portions PP1 disposed on the rear surface 110b of the substrate 110. The inactive area IA of the substrate 110 may be the lower edge area of the substrate 110 shown in FIG. 1.

The second pad portions PP2 are disposed on the second edge of the rear surface of the substrate 110 such that they are spaced apart from one another at a regular spacing. Each of the second pad portions PP2 includes a plurality of second pads.

The second routing lines RL2 are electrically connected to a plurality of pixel driving lines disposed on the front surface 110a of the substrate 110, more specifically, ends of the plurality of gate lines GL, and are extended to the side surfaces and the rear surface of the substrate 110 in the inactive area of the substrate 110 to be electrically connected to the second pad portions PP2. That is, each of the plurality of second routing lines RL2 is provided to surround the outer side surface of the second side of the substrate 110. One end thereof is connected to the plurality of gate lines GL in the inactive area IA of the substrate 110, and the other end thereof is connected to the second pads of the respective second pad portions PP2 disposed on the rear surface 110b of the substrate 110. The inactive area IA of the substrate 110 may be the right edge area of the substrate 110 shown in FIG. 1.

There may be problems such as a short-circuit between the electrodes during the process of aligning with the substrate 110 taking into account the width of the electrodes or the like, in electrically connecting the gate lines GL and the data lines DL disposed on the front surface 110a of the substrate 110 with the electrodes or the pads on the rear surface 110b of the substrate 110 via the first routing lines RL1 and the second routing lines RL2. Technical configurations associated with such problems will be described in detail below.

Each of the plurality of data driving circuits 310 includes a plurality of data flexible circuit films 311 and a plurality of data driving integrated circuits 313.

Each of the plurality of data flexible circuit films 311 may be attached to the plurality of first pad portions PP1 disposed on the rear surface 100b of the substrate 110 via a film attaching process.

Although not specifically shown in the drawings, when the substrate 110 is made up of two or more substrates, the data driving circuits 310 and the gate driving circuits 330 may be mounted on different substrates, respectively, and then may be attached to the substrate 110. In this case, they may be mounted directly on the rear surface 110b of the substrate 110. Alternatively, they may also be mounted directly on the rear surface of a single substrate. Hereinafter, a configuration in which the flexible circuit films 311 and 331 are used as shown in FIG. 9 will be described.

Each of the plurality of data driving integrated circuits 313 is individually mounted on the respective data flexible circuit films 311. Each of the plurality of data driving integrated circuits 313 receives sub-pixel data and a data control signal provided from the timing controller 370 and converts the sub-pixel data into analog voltage data for each sub-pixel in response to a data control signal and supplies it to the respective data line DL.

Optionally, the plurality of data driving integrated circuits 313 may not be mounted on the data flexible circuit films 311, but may be mounted directly on the rear surface 110b of the substrate 110 such that they are connected to the plurality of first pad portions PP1, respectively. Each of the plurality of data driving integrated circuits 313 may be mounted on the rear surface 100b of the substrate 110 via a chip mounting process according to the chip-on-glass technology. In this case, the data flexible circuit films 311 may be eliminated, thereby simplifying the configuration of the data driving circuits 310.

Each of the plurality of gate driving circuits 330 includes a plurality of gate flexible circuit films 331 and a plurality of gate driving integrated circuits 333.

Each of the plurality of gate flexible circuit films 331 may be attached to the plurality of second pad portions PP2 disposed on the rear surface 100b of the substrate 110 via a film attaching process.

Each of the plurality of gate driving integrated circuits 333 is individually mounted on the respective gate flexible circuit films 331. Each of the plurality of gate driving integrated circuits 333 generates a scan pulse based on the gate control signal provided from the timing controller 370 and supplies the generated scan pulses to the gate line GL in a predetermined order.

Optionally, the plurality of data driving integrated circuits 333 may not be mounted on the gate flexible circuit films 331, but may be mounted directly on the rear surface 110b of the substrate 110 such that they are connected to the plurality of second pad portions PP2, respectively. Each of the plurality of gate driving integrated circuits 333 may be mounted on the rear surface 100b of the substrate 110 via a chip mounting process according to the chip-on-glass technology. In this case, the gate flexible circuit films 331 may be eliminated, thereby simplifying the configuration of the gate driving circuits 330.

The control board 350 is connected to each of the plurality of data flexible circuit films 311 and each of the plurality of gate flexible circuit films 331. For example, the control board 350 may be electrically connected to the plurality of data flexible circuit films 311 through a plurality of first signal transmission cables STC1, and to the plurality of gate flexible circuit films 331 through a plurality of second signal transmission cables STC2. The control board 350 supports the timing controller 370 and serves to transmit signals and power among the elements of the display driving circuit.

The timing controller 370 is mounted on the control board 350 and receives image data and a timing synchronization signal provided from a display drive system through a user connector provided on the control board 350. The timing controller 370 arranges the image data according to the sub-pixel arrangement structure of the active area AA based on the timing synchronization signal to generate sub-pixel data, and provides the generated sub-pixel data to the corresponding data driving integrated circuit 313. In addition, the timing controller 370 generates the data control signal and the gate control signal based on the timing synchronization signal so as to control the driving timings of each of the plurality of data driving integrated circuits 313 and each of the plurality of gate driving integrated circuits 333.

Additionally, the plurality of data driving integrated circuits 313, the plurality of gate driving integrated circuits 333 and the timing controller 370 may be implemented as a signal driving integrated circuit. In this case, the single integrated driving integrated circuit is mounted on the rear surface 110b of the substrate 110, and each of the plurality of first routing lines RL1 and each of the plurality of second routing lines RL2 may be further routed to the rear surface 110*b* of the substrate 110 to be electrically connected to a corresponding channel provided in the single driving integrated circuit. In this case, the plurality of first pad portions PP1, the plurality of second pad portions PP2, the plurality of data flexible circuit films 511, and the plurality of gate flexible circuit films 331 are eliminated.

Additionally, in this example, each corner of the substrate 110 may be chamfered to have a predetermined angle or length, or rounded to have a predetermined curvature. Accordingly, according to an exemplary embodiment of the present disclosure, the plurality of first routing lines RL1 and the plurality of second routing lines RL2 may be easily formed on the corners and the outer side of the outer side walls of the substrate 110 without disconnection.

FIG. 10 is a cross-sectional view taken along line I-I' shown in FIG. 1 according to an exemplary embodiment of the present disclosure. Referring to FIG. 10, a display device according to an exemplary embodiment of the present disclosure includes a substrate 110 and a wiring electrode 510.

The substrate 110 may be defined as a thin-film transistor array substrate. The substrate 110 according to an exemplary embodiment of the present disclosure may include a base plate, pixel driving wirings and a plurality of sub-pixels, and may be made up of one or more substrates attached together.

The substrate 110 may be made of glass or plastic material, preferably a glass material. The substrate 110 includes the active area AA and the inactive areas IA (BA). The active area AA may be defined as the area of the substrate 110 except for the edge and may also be defined as an area in which sub-pixels defined as the pixel circuits PC are disposed. The inactive area IA may be defined as the outer periphery of the active area AA. The inactive area IA has a relatively small width and may also be defined as the bezel area.

Wirings for driving pixels and supplying power, especially driving wirings, such as the data lines DL, are disposed on the front surface 110*a* of the substrate 110 to supply signals necessary for driving of the pixels. The pixel drive wirings according to an exemplary embodiment of the present disclosure include a plurality of data wirings, a plurality of gate wirings, a plurality of drive power wirings, and a plurality of common power wirings.

The wirings disposed on the front surface 110*a* of the substrate 110 are connected to the rear surface 110*b* of the substrate 110 through the connection electrodes 510. As described above with respect to FIG. 9, the control board 350 including the timing controller 370 is disposed on the rear surface 110*b* of the substrate 110, and a signal transmission cable STC is connected to a routing line RL via the control board 350 and a pad portion PP.

The routing line RL may be electrically connected to the pad portion PP and electrically connected to the signal transmission cable STC. The routing line RL is electrically connected to the wiring electrode 510.

As described above, the wiring electrode 510 is disposed such that it covers the side surface of the substrate 110, and electrically connects the electrode such as the data line DL disposed on the front surface 110*a* of the substrate 110 with the routing line RL disposed on the rear surface 110*b* of the substrate 110.

Although not shown in the drawings, a pad portion connected to the wiring electrode 510 may further be disposed at the end of the data line DL for facilitating electrical connection between the data line DL and the wiring electrode 510.

The wiring electrode 510 may be made of a mixture of a highly conductive material such as silver (Ag) and a viscous ink, or may be a mixture of a conductive material in order to reduce the electric resistance and to be easily disposed on the side surface of the substrate 110. It is, however, to be understood that the present disclosure is not limited thereto.

The wiring electrode 510 may be covered with an anti-oxidation layer for preventing oxidation or a passivation layer. The anti-oxidation layer or the passivation layer may be attached on the wiring electrode 510 in the form of a separate tape.

As described above, by electrically extending the electrodes such as the data line DL connected to the pixel circuit PC disposed on the front surface 110*a* of the substrate 110 to the rear surface 110*b* of the substrate 110 by using the wiring electrode 501, it is not necessary to dispose the elements that may form other electric circuits such as the routing line RI, and the anti-static-electricity circuit on the front surface 110*a* of the substrate 110. As a result, it is possible to significantly reduce the width of the inactive area IA.

In this manner, the size of the inactive area IA is significantly reduced, such that it is possible to avoid the bezel area from being seen by a user in a multi-screen display device using multiple display devices. In order to avoid the inactive area IA from being visible to a user in a multi-screen display device, the width of the inactive area IA is required to be smaller than half the distance between the unit pixels consisting of a plurality of pixels. The above-described wiring electrode 510 allows the width of the inactive area IA to be reduced significantly.

The substrate 110 according to an exemplary embodiment of the present disclosure may include an inclined portion or a curved portion at each upper corner between the front surface 110*a* and each side surface. The corners of the side surfaces of the substrate 110 may be chamfered to have a predetermined angle or length by a chamfering process, or rounded to have a predetermined curvature by a grinding process (or a substrate rounding process).

As the corners of the side surfaces of the substrate 110 are not sharp but have inclined or curved shape, the wiring electrode 510 can be extended from a part of the front surface 110*a* of the substrate 110 to the rear surface 110*b* of the substrate 110 through the side surfaces.

Optionally, one side of the substrate 110 may have a curved surface having a predetermined curvature, e.g., a cross section in a semicircular or semi-elliptical shape, by a grinding process (or a substrate rounding process).

The wiring electrode 510 supplies a data signal to each of the plurality of data lines DL. Although the data line DL is shown the drawing, the present disclosure is not limited thereto. It may be an electrode extended from the active area AA.

The wiring electrode 510 may be extended to the rear surface 110*b* of the substrate 110 and may be electrically connected to the routing line RL. The routing line RL is electrically connected to the signal transmission cable STC via the pad portion PP and ultimately connected to the control board 350 having the timing controller 370.

In the drawing, the wiring electrode 510 covers the data line DL on the front surface 110*a* of the substrate 110 and the routing line RL on the rear surface 110*b* of the substrate 110 to be electrically connected thereto. It is, however, to be understood that the wiring electrode 510 may be covered by the data line DL and the routing line RL.

In order to describe an exemplary embodiment of the present disclosure, the electrical connection from the data line DL disposed on the front surface 110a of the substrate 110 to the rear surface 110b of the substrate 110 through the wiring electrode 510 has been described above as an example. It is to be understood that other elements in the active area AA may also be electrically connected to the rear surface 110b of the substrate 110 by the above-described connection through the wiring electrode 510.

As such, in the display device according to an exemplary embodiment of the present disclosure, the electrodes on the front surface 110a of the substrate 110 may be electrically connected to the elements on the rear surface 110b of the substrate 110 through the wiring electrode 510, such that the display device can have the inactive area IA (BA) that is appropriate for reducing the boundary between the display devices connected to one another in a multi-screen display device.

FIG. 11 is a schematic view for illustrating the connection between the electrodes according to an exemplary embodiment of the present disclosure.

The above-described connection between the wiring electrode 510 and the electrode will be described reference to FIG. 11. At least one data line DL is disposed on the front surface 110a of the substrate 110 and a routing line RL is disposed on the rear surface 110b of the substrate 110. The data line DL and the routing line RL may be referred to as a first electrode and a second electrode, respectively, for convenience of illustration.

A plurality of wiring electrodes 510 is extended from the front surface 110a of the substrate 110 to the rear surface 110b of the substrate 110. The wiring electrode 510 may be disposed by mixing a highly conductive material such as silver (Ag) in the form of powder with a fixing solution such as ink and printing it onto the side surface of the substrate 110.

When the wiring electrode 510 is disposed on the side surface of the substrate 110 by printing it, the wiring electrode 510 may be printed as fine electrodes 511 and 512 having a width W' of 8 to 10 µm.

The electrode width W of each of the electrodes of the plurality of data lines DL and the routing lines RL on the front surface 110a and the rear surface 110b of the substrate 110, respectively, may range from 50 to 80 µm.

The wiring electrode 510 may be disposed by printing it on the side surface of the substrate 110 so that it has a pitch P of 17 to 25 µm. The data line DL and the routing line RL may be connected to each other through at least one wiring electrode 510.

Incidentally, the wiring electrodes 510 may be arranged at a wide or narrow spacing. Depending on the spacing between the wiring electrodes 510, at least one of the fine electrodes 511 and 512 of the wiring electrodes 510 may be a dummy electrode 512 that is connected to none of the data line DL and the routing line RL.

As described above, the wiring electrode 510 surrounds the side surface of the substrate 110 and is made mainly of a highly conductive material such as silver (Ag). Therefore, it may be necessary to insulate the wiring electrode 510 from an electrode disposed on the edge of the display device.

Accordingly, the wiring electrode 510 may be covered by an insulating tape for surface insulation and a material with low electrical conductivity may be disposed on the wiring electrode 510. An insulating layer or an insulating tape may be disposed to cover the wiring electrode 510 for insulation of the wiring electrode 510 as described above. Alternatively, the wiring electrode 510 may have a multi-layered structure, in which a material having a low electrical conductivity is disposed at the top. By doing so, the wiring electrode can be insulated without a process of attaching an insulating layer or an insulating tape additionally.

The wiring electrode 510 may be formed as the fine electrodes 511 and 512 printed on the side surface of the substrate 110 as described above. The fine electrodes 511 and 512 may be arranged in a vertical shape, a curved shape, or an oblique shape on the side surface of the substrate 110. The wiring electrode 510 disposed on the side surface of the substrate 110 may be formed as a variety of fine electrodes 511 and 512 so that the data line DL on the front surface 110a of the substrate 110 is electrically connected to the routing line RL on the rear surface 110b through the wiring electrode 510 depending on the precision at which the data lines DL is aligned with the routing lines RL (or if they are designed such that they are disposed at different positions).

FIG. 12 is a schematic view for illustrating a multi-screen display device employing a display device according to an exemplary embodiment of the present disclosure.

The multi-screen display device employing a display device according to an exemplary embodiment of the present disclosure includes multiple screen modules 600-1, 600-2, 600-3, and 600-4 and a housing 700.

The screen modules 600-1, 600-2, 600-3 and 600-4 are arranged in a matrix of N by M, where N is a positive integer equal to or greater than two, and M is a positive integer equal to or greater than two, to display different images or sub-images of an image. Each of the multiple screen modules 600-1, 600-2, 600-3 and 600-4 includes the above-described display device; and, therefore, the redundant description will be omitted.

The multiple screen modules 600-1, 600-2, 600-3 and 600-4 employing the display device according to an exemplary embodiment of the present disclosure may be attached to one another on their side surfaces via module connecting members. The module connecting members are used to connect between the side surfaces of two adjacent ones of the multiple screen modules 600-1, 600-2, 600-3 and 600-4 to implement a multi-screen display device.

Each module used in the multiple screen modules 600-1, 600-2, 600-3 and 600-4 employs the display device with reduced inactive area according to an exemplary embodiment of the present disclosure, such that the dark areas generated by the boundaries between the screen modules 600-1, 600-2, 600-3 and 600-4 can be reduced or eliminated. As a result, seamless images can be displayed throughout the screen.

It will be apparent to those skilled in the art that various modifications and variations can be made in the display device and the method for fabricating the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a substrate with light-emitting elements and wiring electrodes for supplying driving signals and current thereto;
a circuit board disposed on the substrate and covering a part of the wiring electrodes, a plurality of circuit wirings being disposed on a first surface of the circuit board, the circuit board including:
an inclined surface sloping down from the first surface, and
a side surface at an end of the inclined surface to form a step with respect to the substrate; and a plurality of connection electrodes on the inclined surface of the circuit board and extending between the substrate and the first surface of the circuit board, and respectively connecting the wiring electrodes on the substrate to the circuit wirings on the first surface of the circuit board.

2. The display device of claim 1, wherein the first surface of the circuit board is parallel to a surface of the substrate.

3. The display device of claim 1, further comprising:
a buffer layer on the substrate at the side surface of the circuit board and under the connection electrodes for covering the step between the circuit board and the substrate.

4. The display device of claim 3, wherein the buffer layer has a tapered shape with an inclined surface aligned with the inclined surface of the circuit board, and
wherein the connection electrodes are on the inclined surface of the of the buffer layer between the substrate and the inclined surface of the circuit board.

5. The display device of claim 1, wherein a reflective layer is disposed between the circuit board and the substrate.

6. The display device of claim 1, wherein the connection electrodes and/or at least one dummy electrode are on the inclined surface of the circuit board and extend from the substrate to the first surface of the circuit board.

7. The display device of claim 6, wherein the dummy electrode and/or the connection electrodes have at least one of diamond, round, wave, and stripe shapes.

8. The display device of claim 1, wherein at least one dummy electrode is disposed between adjacent connection electrodes.

9. The display device of claim 8, wherein the dummy electrode is floating.

10. The display device of claim 1, wherein the circuit board includes a flexible board and at least a part of the circuit board is attached to the substrate.

11. The display device of claim 1, wherein the wiring electrodes include gate lines and/or data lines.

12. The display device of claim 1, further comprising:
a planarization layer on the substrate and under the circuit board, the planarization layer having a side surface aligned with the side surface of the planarization layer; and
a buffer layer on the substrate at the side surface of the circuit board and the side surface of the planarization layer, and under the connection electrodes.

13. A method for fabricating a display device, the method comprising:
disposing wiring electrodes and light-emitting elements on a substrate;
disposing a circuit board on the substrate to cover a part of the wiring electrodes, the circuit board having a first surface, on which a plurality of circuit wirings is disposed, an inclined surface sloping down from the first surface, and a side surface at an end of the inclined surface, the side surface being at a steeper angle with respect to the substrate than the inclined surface; and
disposing connection electrodes on the inclined surface of the circuit board for respectively connecting the wiring electrodes on the substrate with the circuit wirings on the circuit board.

14. The method of claim 13, wherein the disposing of the circuit board on the substrate further comprises:
bonding the substrate and the circuit board using an adhesive.

15. The method of claim 13, wherein the connecting of the wiring electrodes on the substrate with the circuit wirings on the circuit board comprises:
applying a conductive material so that a part of the wiring electrodes is connected to the circuit wirings, respectively, and then patterning the connection electrodes using a laser.

16. The method of claim 13, further comprising:
disposing a buffer layer on the substrate at the side surface of the circuit board, the buffer layer having a tapered shape with an inclined surface aligned with the inclined surface of the circuit board,
wherein the disposing of the connection electrodes includes disposing the connection electrodes on the inclined surface of the of the buffer layer and the inclined surface of the circuit board.

17. The method of claim 13, further comprising:
disposing a planarization layer on the substrate,
wherein the disposing of the circuit board on the substrate includes disposing the circuit board on the planarization layer on the substrate.

18. A display device, comprising:
a substrate with light-emitting elements and wiring electrodes for supplying driving signals and current to the light-emitting elements;
a circuit board disposed on the substrate and covering a part of the wiring electrodes, a plurality of circuit wirings being disposed on a first surface of the circuit board; and
a plurality of connection electrodes respectively connecting the wiring electrodes to the circuit wirings,
wherein the circuit board has an inclined surface, and the connection electrodes extend on the inclined surface to the first surface of the circuit board,
wherein the connection electrodes are implemented in a pattern of fine electrodes and disposed on the inclined surface, and
wherein the pattern of fine electrodes comprises connection electrodes having a smaller width and a smaller separation distance between each other than the wiring electrodes or the circuit wirings.

19. The display device of claim 18, wherein the inclined surface is disposed between the first surface and the substrate, or the first surface extends in parallel to the substrate.

20. The display device of claim 18, further comprising:
a buffer layer at the inclined surface of the circuit board to compensate for a step difference between the circuit board and the substrate.

* * * * *